United States Patent
Moriya et al.

(10) Patent No.: US 7,429,530 B2
(45) Date of Patent: Sep. 30, 2008

(54) METHOD OF FORMING A PATTERN, METHOD OF FORMING WIRING, SEMICONDUCTOR DEVICE, TFT DEVICE, ELECTRO-OPTIC DEVICE, AND ELECTRONIC INSTRUMENT

(75) Inventors: Katsuyuki Moriya, Nagano (JP); Toshimitsu Hirai, Nagano (JP)

(73) Assignee: Seiko Epson Corporation (JP)

( * ) Notice: Subject to any disclaimer, the term of this patent is extended or adjusted under 35 U.S.C. 154(b) by 455 days.

(21) Appl. No.: 11/232,328

(22) Filed: Sep. 21, 2005

(65) Prior Publication Data
US 2006/0076563 A1  Apr. 13, 2006

(30) Foreign Application Priority Data
Oct. 12, 2004  (JP)  ............... 2004-297207

(51) Int. Cl.
*H01L 21/44*  (2006.01)
(52) U.S. Cl. ................. 438/669; 257/72; 257/E21.174; 257/E21.582
(58) Field of Classification Search .................. 257/72, 257/E21.174, E21.582; 438/669
See application file for complete search history.

(56) References Cited

U.S. PATENT DOCUMENTS

| | | | | |
|---|---|---|---|---|
| 6,303,963 | B1 * | 10/2001 | Ohtani et al. | 257/350 |
| 7,119,026 | B2 * | 10/2006 | Honda et al. | 438/748 |
| 7,129,166 | B2 * | 10/2006 | Speakman | 438/674 |
| 2004/0048001 | A1 | 3/2004 | Kiguchi et al. | |
| 2005/0242394 | A1 | 11/2005 | Nakabayashi et al. | |

FOREIGN PATENT DOCUMENTS

JP  2003-315813  11/2003
JP  2004-095896  3/2004

* cited by examiner

*Primary Examiner*—Asok K Sarkar
(74) *Attorney, Agent, or Firm*—Harness, Dickey & Pierce, P.L.C.

(57) ABSTRACT

A method of forming a pattern of a functional layer on a surface of a substrate, where a pattern region, to which the pattern is provided, is edged with a boundary layer, and has a first region and a second region communicated with the first region and having a narrower width than the first region, the method includes: providing an intermediate layer having adhesiveness with the substrate and lyophilicity with a functional fluid to the first and the second regions; ejecting a droplet of the functional fluid to the first region; and allowing the droplet of the functional fluid ejected to the first region to automatically flow to the second region with the lyophilicity with the intermediate layer.

15 Claims, 11 Drawing Sheets

METHOD OF FORMING A PATTERN, METHOD OF FORMING WIRING, SEMICONDUCTOR DEVICE, TFT DEVICE, ELECTRO-OPTIC DEVICE, AND ELECTRONIC INSTRUMENT

BACKGROUND OF THE INVENTION

1. Technical Field

The invention relates to a method of forming a pattern for forming a fine pattern using a fluid ejecting process, a method of forming wiring, a semiconductor device, a TFT device, an electro-optic device, and an electronic instrument.

2. Related Art

As a method of forming wiring having fine pitches and adhesiveness with a surface of the substrate using a fluid ejecting process, a method disclosed in Japanese Unexamined Patent Publication No. 2003-315813 has been proposed. According to this method, firstly a surface of the substrate is treated with a lyophobicity providing process before forming the wiring by ejecting conductive functional fluid to the substrate. And, fluid of a material for forming an intermediate layer having adhesiveness with both of the substrate and the conductive functional fluid is subsequently ejected to the surface of the substrate. Since the substrate is provided with lyophobicity, the material fluid can be prevented from spreading after ejected thereon, thus fine pitch wiring can be formed. By ejecting the conductive functional fluid on the intermediate layer thus formed, fine pitch wiring having good adhesiveness with the substrate can be formed.

However, in the related art, the material fluid is prevented from spreading by the lyophobicity of the substrate to realize the fine pitch wiring. Therefore, if the lyophobicity of the substrate is made stronger to realize the wiring with a further fine pitch, the adhesiveness between the material fluid and the substrate is lowered. Further, there is a limitation for making the pitch of wiring finer in forming the wiring depending on the lyophobicity of the substrate.

SUMMARY

In view of the above problems, an advantage of the invention is to provide a pattern forming method capable of forming a finer wiring pattern on a surface of a substrate, a wiring forming method, a semiconductor device, a TFT device, an electro-optic device, and an electronic instrument using the wiring pattern.

A pattern forming method according to a first aspect of the invention is a method of forming a pattern of a functional layer on a surface of a substrate using a process of ejecting a droplet of functional fluid by a droplet ejection device. A pattern region, to which the pattern is provided, is edged with a boundary layer, and has a first region and a second region communicated with the first region and having a narrower width than the first region. And, the pattern forming method includes the step of providing an intermediate layer having adhesiveness with the substrate and lyophilicity with a functional fluid to the first and the second regions, the step of ejecting a droplet of the functional fluid to the first region, and the step of allowing the droplet of the functional fluid ejected to the first region to automatically flow to the second region with the lyophilicity with the intermediate layer.

According to this pattern forming method, in order for providing the functional layer to the first region formed on the surface of the substrate with the boundary layer and the second region communicated with the first region and narrower in width than the first region, the intermediate layer having adhesiveness with the substrate and lyophilicity with the functional fluid for forming the functional layer is firstly formed. Subsequently, using the droplet ejection device, the droplet of the functional fluid is ejected, lapping over the intermediate layer, only to the first region communicated with the second region, but not ejected to the second region. The droplet of the functional fluid ejected to the first region spreads on the second region from the first region to wet the second region in the help of the lyophilicity with respect to the intermediate layer. Therefore, the functional layer can be formed by inducing the functional fluid to automatically flow to the second region having a narrow width without ejecting the functional fluid to the second region. As described above, this pattern forming method is effective because the functional layer can be provided to a region as narrow as the second region requiring droplets smaller than the width of the second region, which is difficult to realize, without ejecting the droplet of the functional fluid directly to the second region. Generally, if a droplet of the functional fluid having a large diameter is ejected to the second region, the droplet runs on the boundary layer to easily cause the residual dross of the functional fluid. Such residual dross of the functional fluid sometimes diffuses to other layers to cause malfunctions, and therefore, even the residual dross needs to be removed from other areas than the predetermined area. The pattern forming method according to the aspect of the invention is effective in such cases. Meanwhile, regarding the intermediate layer, it is enough to consider adhesiveness and lyophilicity with the functional layer, accordingly, materials free from the diffusion problems can be selected, and further, if the residual dross remains on the boundary layer, the performance is not affected. Therefore, various forming method can be adopted.

A wiring forming method according to a second aspect of the invention is a method of forming a wiring including a conductive layer formed of a conductive functional fluid on a surface of a substrate using a process of ejecting a droplet of functional fluid by a droplet ejection device. In this case, a region, to which the wiring is provided, is edged with a boundary layer, and has a first region and a second region communicated with the first region and having a narrower width than the first region. And, the wiring forming method includes the step of providing an intermediate layer having adhesiveness with the substrate and lyophilicity with a conductive functional fluid to the first and the second regions, the step of ejecting a droplet of the conductive functional fluid to the first region, and the step of allowing the droplet of the conductive functional fluid ejected to the first region to automatically flow to the second region with the lyophilicity with the intermediate layer. Further, the step of providing the intermediate layer preferably includes the step of ejecting droplets of an intermediate layer forming functional fluid to the first and the second regions, the intermediate layer forming functional fluid having adhesiveness with the substrate and lyophilicity with the conductive functional fluid, and the step of forming the covering layer preferably includes the step of ejecting a droplet of a covering layer forming functional fluid to the first region, and the step of allowing the droplet of the covering layer forming functional fluid ejected to the first region to automatically flow to the second region with the lyophilicity with the conductive layer.

According to this wiring forming method, in order for providing the wiring including conductive layer to the first region formed on the surface of the substrate with the boundary layer and the second region communicated with the first region and narrower in width than the first region, the intermediate layer having adhesiveness with the substrate and lyophilicity with the conductive functional fluid for forming the conductive layer is firstly formed. The intermediate layer is preferably formed by ejecting the droplets of the intermediate layer forming functional fluid to the first and the second regions of the surface of the substrate using the droplet ejection device. Subsequently, the droplet of the conductive functional fluid is ejected, lapping over the intermediate layer, only to the first region communicated with the second region, but not ejected to the second region. The droplet of the conductive functional fluid ejected to the first region spreads on the second region to wet the second region in the help of lyophilicity with the intermediate layer. The conductive layer can be formed by inducing the functional fluid to automatically flow to the second region having a narrow width without ejecting the conductive functional fluid to the second region. As described above, this wiring forming method is effective because the conductive layer can be provided to a region as narrow as the second region requiring droplets smaller than the width of the second region, which is difficult to realize, without ejecting the droplet of the conductive functional fluid directly to the second region. And, as a preferable method of forming the covering layer lapping over the conductive layer, a droplet of the covering layer forming functional fluid having adhesiveness with the conductive layer and lyophilicity with the conductive layer is ejected by the droplet ejection device. The droplet of the covering layer forming functional fluid is ejected to the first region communicated with the second region, as is the case with the droplet of the conductive functional fluid. In this case, although the droplet of the covering layer forming functional fluid is not ejected to the second region, the droplet of the covering layer forming functional fluid ejected to the first region spreads on and wet the second region in the help of lyophilicity with the conductive layer to form the covering layer. As described above, the covering layer can be formed similarly to the conductive layer. Generally, if a droplet of the conductive functional fluid having a large diameter is ejected to the second region, the droplet runs on the boundary layer to easily cause the residual dross of the conductive functional fluid. Such conductive residual dross sometimes diffuses to other layers to cause malfunctions, and therefore, even the residual dross needs to be removed from other areas than the predetermined area. Meanwhile, regarding the intermediate layer, materials free from the diffusion problems can be selected without considering conductivity, and further, if the residual dross remains on the boundary layer, the performance is not affected. Further, by covering the conductive layer with the covering layer, the conductive layer can be protected, and the diffusion of the conductive layer can further be prevented.

In this case, each of a contact angle of the droplet of the conductive functional fluid on the intermediate layer and a contact angle of the droplet of the covering layer forming functional fluid on the conductive layer is preferably no greater than 20 degrees.

According to this configuration, the conductive functional fluid and the covering layer forming functional fluid are ejected only to the first region, and spread respectively on and wet the intermediate layer and the conductive layer to the second region after ejected. In order to assure that the conductive functional fluid and the covering layer forming functional fluid surely spread from the first region to the second region while wetting the surfaces, the respective contact angles on the intermediate layer and the conductive layer need to be no greater than 20 degrees. By selecting such combinations, the intermediate layer and the covering layer can be provided only to the predetermined regions even in the narrow regions to which the ejection of the droplet is difficult.

In this case, the substrate preferably has lyophilicity with the droplet, and the boundary layer preferably has lyophobicity with the droplet.

According to the present configuration, especially in forming the intermediate layer, even if the droplet of the intermediate layer forming functional fluid runs on the boundary layer, the droplet is pulled in to the substrate side in the help of the lyophilicity of the substrate, and further, according to the lyophobicity of the boundary layer, it can hardly remain as the residual dross.

In this case, the droplet of the intermediate layer forming functional fluid preferably contains fine particles of one of manganese and a manganese alloy.

According to this configuration, the droplet of the intermediate layer forming functional fluid contains fine particles of one of manganese and a manganese alloy. The intermediate layer composed of manganese or a manganese alloy has adhesiveness with glass or the like used for the substrate, and has lyophilicity with respect to the droplet of the conductive functional fluid. The droplet of the conductive functional fluid, when ejected to the intermediate layer, spreads on the surface of the intermediate layer while wetting the surface, because of the lyophilicity with the intermediate layer, to form the conductive layer having good adhesiveness with the intermediate layer. As described above, manganese or a manganese alloy is suitable for the intermediate layer, which can improve adhesiveness of the conductive layer by adhering the conductive layer indirectly via the intermediate layer even if the conductive layer has weak adhesiveness with the surface of the substrate. Further, manganese or a manganese alloy has a property of a so-called cap metal, and can prevent substrate defects caused by residual dross by capping minor residual dross on the surface of the substrate.

In this case, the droplet of the conductive functional fluid preferably contains fine particles of one of silver and a silver alloy.

According to this configuration, as the conductive material for forming the conductive layer, silver or a silver alloy is used. Since the droplet containing micro particles of silver or an silver alloy is easy to be handled, and ejected as droplets, and further can be calcined at a relatively low temperature, it is a desirable material for forming the conductive layer using the droplet ejection process.

In this case, the droplet of the covering layer forming functional fluid preferably contains fine particles of one of nickel and a nickel alloy.

According to the present configuration, silver or a silver alloy forming the conductive layer sometimes causes reaction such as diffusion with a material such as silicon nitride (SiN) formed adjacent to the conductive layer. In order for preventing such a reaction, the covering layer is formed so as to cover the conductive layer. The covering layer is preferably formed of nickel or a nickel alloy having a stable characteristic.

In this case, the droplets are at least one of dried or calcined to form respective one of the intermediate layer, the conductive layer, and the covering layer after ejected by the droplet ejection device.

According to the present configuration, the droplet ejected from the droplet ejection device forms a liquid layer on the surface of respective one of the substrate, the intermediate layer, and the conductive layer, and by executing both or either one of the drying and calcining processes on the liquid layer, respective one of the intermediate layer, the conductive layer, and the covering layer. Specifically, by removing the dispersion medium dispersing the manganese, silver, or nickel, or alloys thereof from the liquid layer, the intermediate layer, the conductive layer, or the covering layer composed-of manganese, silver, or nickel, or alloys thereof are respectively formed.

A semiconductor device according to another aspect of the invention includes the wiring formed using the method of forming a wiring according to the aspect of the invention.

According to the semiconductor device using the wiring according to the wiring forming method of the invention, can be made more compact and high density, thus providing a compact and high performance semiconductor device.

The TFT device according to another aspect of the invention is formed using the wiring forming method of the invention, wherein the gate wiring region is the first region, and the gate electrode region is the second region.

According to this TFT device, the region of the TFT device to which the gate wiring is provided and the region of the TFT device to which the gate electrode is provided respectively corresponds to the first region and the second region formed by the wiring forming method of the invention. The gate electrode having a narrow width is formed on the surface of the TFT substrate by the similar method for forming the wiring composed of the three layers, namely the intermediate layer, the conductive layer, and the covering layer in the second region. Therefore, even if the gate electrode of the TFT device has a microscopic width, the intermediate layer, the conductive layer, and the covering layer can efficiently be provided to the gate electrode.

The electro-optic device according to another aspect of the invention uses the wiring, the semiconductor device, or the TFT device formed using the above aspects of the invention.

According to the electro-optic device, high accuracy mounting can be achieved using the fine wiring and the high density semiconductor device formed using the wiring forming method of the invention. Further, by applying the wiring forming method to the TFT device, the narrow gate electrode can easily be formed. The electronic instrument using the fine wiring, the semiconductor, and the TFT device hardly suffers from defects in wiring because of superior adhesiveness with the substrate, and further, it is suitable for down sizing. Note that, as the electro-optic device, a liquid crystal display device or the like can be cited.

An electronic instrument according to still another aspect of the invention includes the electro-optic device according to the above aspect of the invention.

According to the electronic instrument, since the electro-optic device composed of a highly reliable wiring, semiconductor device, and TFT device is equipped, high quality electronic instrument can be provided. As such an electronic instrument, a cellular phone, a PC (personal computer), and an electronic watch can be cited.

BRIEF DESCRIPTION OF THE DRAWINGS

The invention will now be described with reference to the accompanying drawings, wherein like numbers refer to like elements, and wherein.

DESCRIPTION OF THE EMBODIMENTS

Hereinafter, embodiments of the invention will be described with reference to the accompanying drawings. The present embodiment is described taking the formation of the wiring in the manufacturing process of a thin film transistor (TFT), the semiconductor device, as an example. In this case, the formation of the wiring pattern is carried out by ejecting droplets of, for example, a conductive functional fluid (a functional fluid) for forming the pattern from a droplet ejecting head onto the substrate using a droplet ejecting process.

Figure 1:
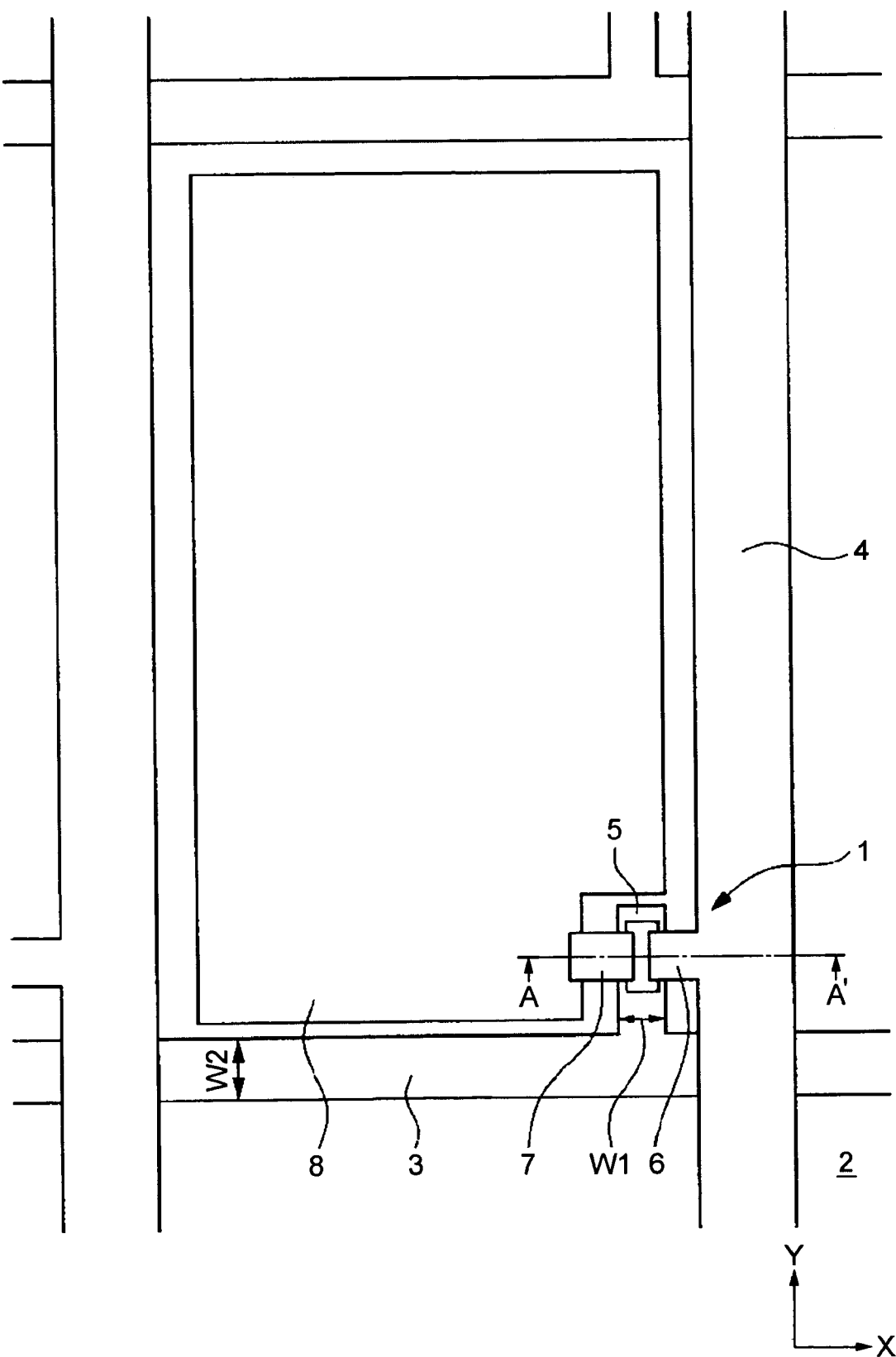
FIG. 1 is a plan view showing a schematic configuration of a TFT substrate to which a TFT is provided.

FIG. 1 is a plan view showing a schematic configuration of a TFT substrate to which a TFT (a TFT device) is provided. As shown in FIG. 1, on a surface of a TFT substrate 2 having the TFT 1, there are disposed gate wiring 3 and source wiring 4 like a grid. The gate wiring 3 is formed to extend in the X-axis direction, and a gate electrode 5 is formed extending in the Y-axis direction from the side of the gate wiring 3. Note that the gate electrode 5 is formed like a dead end, and has width W1 narrower than the width W2 of the gate wiring 3. Further, a source electrode 6 extending in the X-axis direction from the side of the source wiring 4 formed so as to extend in the Y-axis direction is formed like a dead end. The source electrode 6 is formed so that a part of the source electrode 6 overlaps with the gate electrode 5 in a plan view. Further, a drain electrode 7 is formed symmetrically to the source electrode 6 on the Y-axis line passing the center of the width W1 of the gate electrode 5, and a pixel electrode 8 is formed so as to electrically contact to the drain electrode 7. Particularly in the wiring thus configured, the gate electrode 5 having the minute width W1 and communicating with the gate wiring 3 can effectively be formed by the wiring forming method according to the present embodiment.

Figure 2:
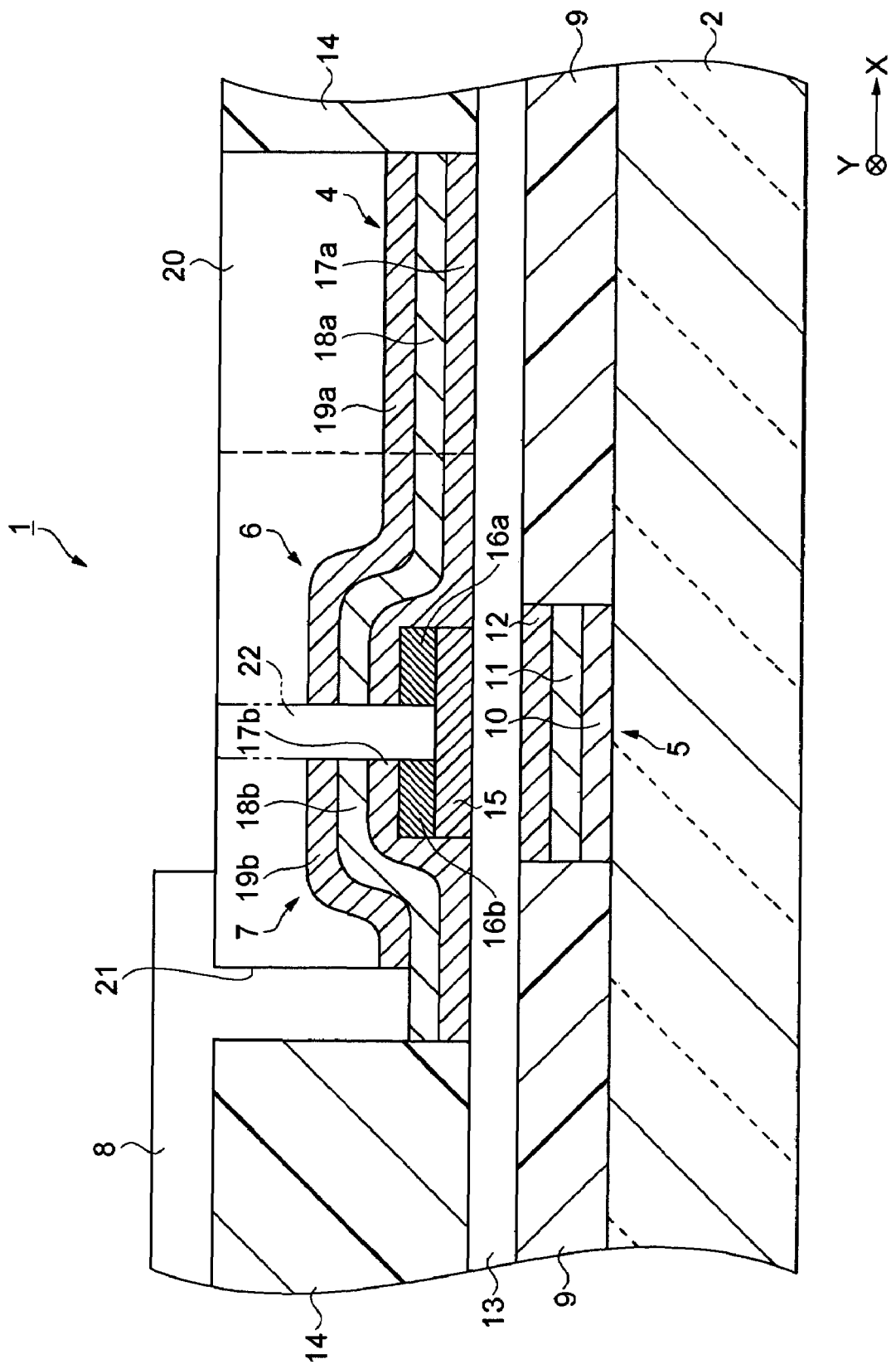
FIG. 2 is a cross-sectional view showing a configuration of the TFT.

The configuration of the TFT 1 will hereinafter be described. FIG. 2 is a cross-sectional view showing the configuration of the TFT. FIG. 2 is a cross-sectional view of the TFT 1 along the A-A' line showing a part thereof where the gate electrode 5, the source wiring 4, the source electrode 6, the drain electrode 7, and the pixel electrode 8 are sequentially stacked on the surface of the TFT substrate 2.

The configuration of the TFT 1 firstly includes a first layer bank (a boundary layer) 9 formed on the surface of the TFT substrate and the gate electrode 5 provided to a dead-end recess defined by the first layer bank 9. The gate electrode 5 includes a gate intermediate layer 10 made of Mn (manganese) or a manganese alloy, a gate conductive layer 11 made of Ag (silver) or a silver alloy for transferring signals, and a gate covering layer 12 made of Ni (nickel) or a nickel alloy. Each of the layers of the gate electrode 5 is formed continuously to the gate wiring 3. And, a gate insulating layer 13 is formed so as to cover the upper surfaces of the gate electrode 5 and the first layer bank 9. The gate insulating layer 13 is made of silicon nitride (SiN). Hereinafter, symbols of Mn, Ag, and Ni include respective alloys.

Mn forming the gate intermediate layer 10 has adhesiveness with TFT substrate 2 and Ag forming the gate conductive layer 11, and also has lyophilicity with a fluid containing Ag. Therefore, a droplet containing Ag, which is ejected using the droplet ejecting process, is easily spread wetting to cover the surface of the gate intermediate layer 10 owing to the lyophilicity with the gate intermediate layer 10. Similarly, the droplet containing Ni, which forms the gate covering layer 12, is spread wetting to cover the surface of the gate conductive layer 11 owing to the lyophilicity with the gate conductive layer 11. Further, Mn forming the gate intermediate layer 10 does not cause diffusion or the like with the gate conductive layer 11, the gate covering layer 12, or the gate insulating layer 13, thus preventing degradation in performance of the TFT 1 caused by the diffusion or the like.

Meanwhile, Ag forming the gate conductive layer 11 is diffused through SiN. Therefore, the gate covering layer 12 is formed in order for insulating the gate insulating layer 13 made of SiN from the gate conductive layer 11. Although the gate covering layer 12 is required in case Ag is used for the gate conductive layer 11, Ag is a desirable material for the gate conductive layer 11 formed using the droplet ejecting process because the droplet containing Ag can be calcined at a relatively low temperature, and is also easy to be handled and ejected.

Further, the TFT 1 includes a second layer bank 14 formed on the gate insulating layer 13, and further includes, in a recess defined by the second layer bank 14, a semiconductor layer 15 formed of an amorphous silicon thin film so as to oppose the area of the gate electrode 5 across the gate insulating layer 13 and bonding layers 16a and 16b formed of n+ type amorphous silicon thin films above the semiconductor layer 15 with predetermined gaps.

The semiconductor layer 15 and the bonding layers 16a, 16b are formed using chemical vapor deposition (CVD) processes, and then patterned using a photolithography process. The gate insulating layer 13 is also formed using the CVD process. Note that the bonding layer 16a is positioned on a portion to which the source electrode 6 is to be provided, and the bonding layer 16b is positioned on a portion to which the drain electrode 7 is to be provided. Further, the semiconductor layer 15 opposing the area of the gate electrode 5 is called as a channel region.

Still further, the TFT 1 includes a first source thin film layer 17a and a first drain thin film layer 17b each made of Ni, a second source thin film layer 18a and a second drain thin film layer 18b each made of Ag, and a third source thin film layer 19a and a third drain thin film layer 19b each made of Ni sequentially covering the bonding layers 16a, 16b, and the gate insulating layer 13 avoiding the channel region. The first source thin film layer 17a, the second source thin film layer 18a, and the third source thin film layer 19a cover the upper surface of the bonding layer 16a, and extend in the positive direction of the X-axis to form the source electrode 6, and further continuously form the source wiring 4. Further, the first drain thin film layer 17b, the second drain thin film layer 18b, and the third drain thin film layer 19b cover the upper surface of the bonding layer 16b, and extend in the negative direction of the X-axis to form the drain electrode 7. And, the TFT 1 includes a source insulating layer 20 covering the source wiring 4, the source electrode 6, the channel region, and the drain electrode 7, and is provided with a conductive hole 21 passing through the third drain thin film layer 19b and the source insulating layer 20, namely from the upper surface of the second drain thin film layer 18b to the upper surface of the source insulating layer 20.

The first source thin film layer 17a, the second source thin film layer 18a, and the third source thin film layer 19a are formed by ejecting droplets respectively containing Ni, Ag, and Ni using the droplet ejecting processes, and then drying and calcining them. In this case, the channel region is prevented from being coated with the droplets by forming a channel bank 22 on the channel region. In a similar manner, the first drain thin film layer 17b, the second drain thin film layer 18b, and the third drain thin film layer 19b are also formed. After then, the channel bank 22 is removed, and the source insulating layer 20 covering the source wiring 4, the source electrode 6, the channel region, and the drain electrode 7 is formed. The upper surface of the source insulating layer 20 and the upper surface of the second layer bank 14 are in a single plane. When forming the source insulating layer 20, the conductive hole 21 for connecting the pixel electrode 8 to the second drain thin film layer 18b is formed.

And, the TFT 1 includes the pixel electrode 8 made of Indium Tin Oxide (ITO) provided on both of the second layer bank 14 and the source insulating layer 20. The pixel electrode 8 is electrically connected to the second drain thin film layer 18b of the drain electrode 7 via the conductive hole 21 filled with ITO. The pixel electrode 8 is formed to be a predetermined pattern using a CVD process and a photolithography process.

Figure 3:
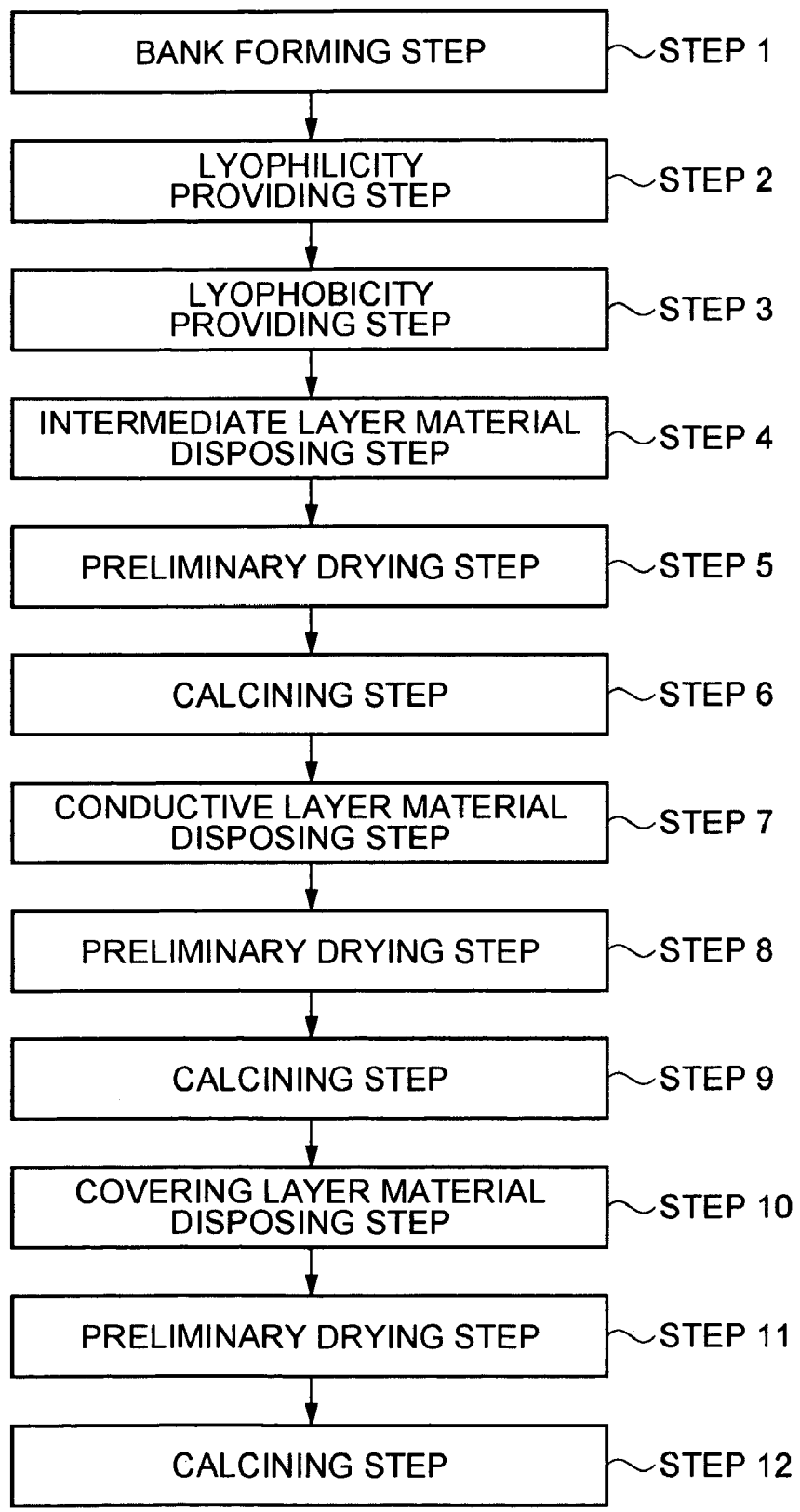
FIG. 3 is a flowchart showing a method of forming a wiring pattern.

A method of forming a wiring (a pattern forming method) according to an embodiment of the invention will hereinafter be described with reference to FIGS. 3, 4A through 4E, 5A through 5D, and 6A through 6C. FIG. 3 is a flowchart showing a method of forming a wiring pattern. In the method of forming the gate wiring 3 and the gate electrode 5 according to the present embodiment, each droplet for forming the wiring described above is disposed on the substrate to form the wiring pattern on the substrate. The forming method includes a bank forming step (step 1) for forming a bank corresponding to the wiring pattern in an extended condition on the substrate, a lyophilicity providing process (step 2) for providing lyophilicity to the substrate, a lyophobicity providing process (step 3) for providing lyophobicity to the bank, an intermediate layer material disposing step (step 4) for disposing droplets of a functional fluid for forming the intermediate layer in an area surrounded by the bank provided with lyophobicity, a preliminary drying step (step 5) for removing at least a part of the liquid component of the disposed droplets, and a calcining step (step 6). Further, the method includes a conductive layer material disposing step (step 7) for disposing droplets of a conductive functional fluid for forming a conductive layer lapping over the intermediate layer, a preliminary drying step (step 8) for removing at least a part of the liquid component of the disposed droplets, a calcining step (step 9), a covering layer material disposing step (step 10) for disposing droplets of a functional fluid for forming the covering layer lapping over the conductive layer, a preliminary drying step (step 11) for removing at least a part of the liquid component of the disposed droplets, and a calcining step (step 12).

Figure 4A:
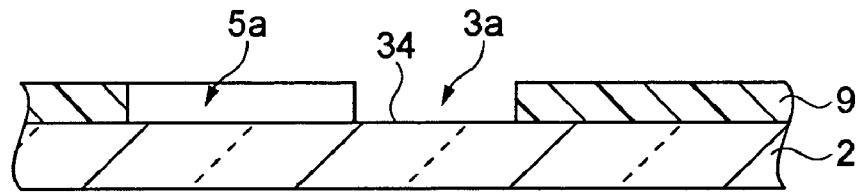
FIGS. 4A through 4E are process charts showing in sequence manufacturing processes of gate wiring and a gate electrode in cross-sectional views.
Figure 4B:
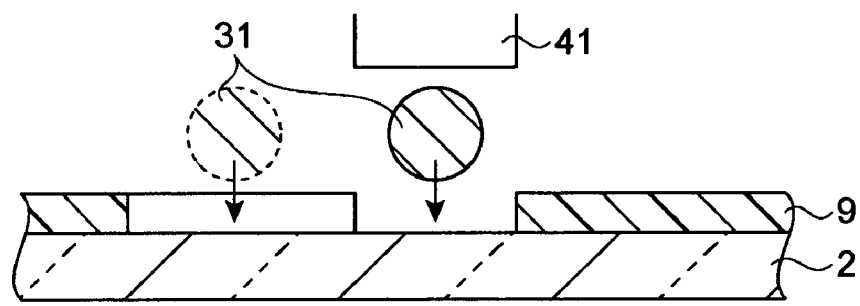
Figure 4C:
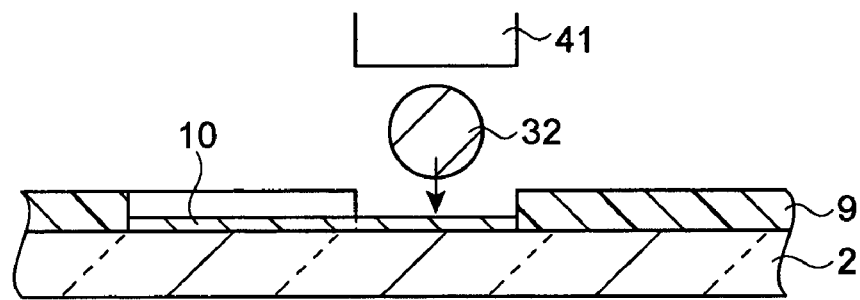
Figure 4D:
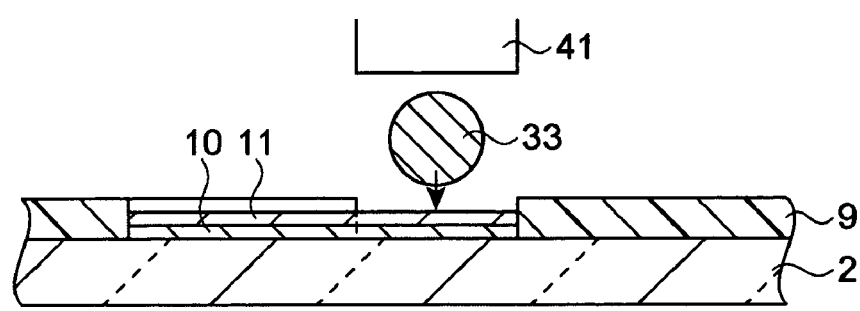
Figure 5A:
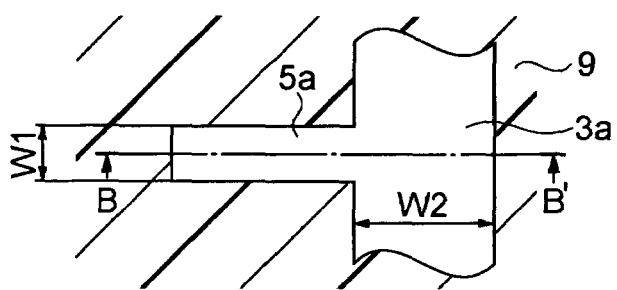
FIGS. 5A through 5D are process charts showing in sequence manufacturing processes of gate wiring and a gate electrode in planar views.
Figure 5B:
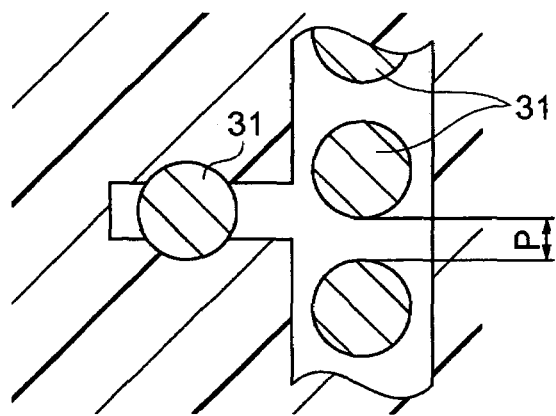
Figure 5C:
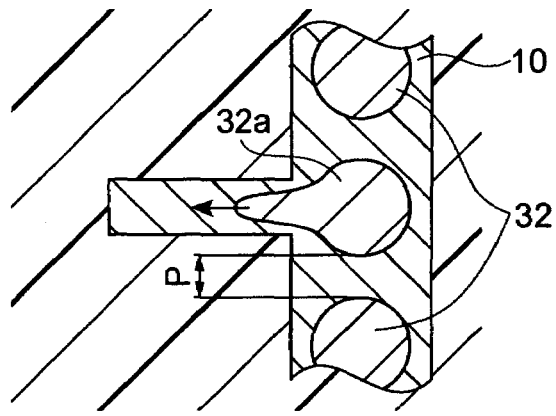
Figure 5D:
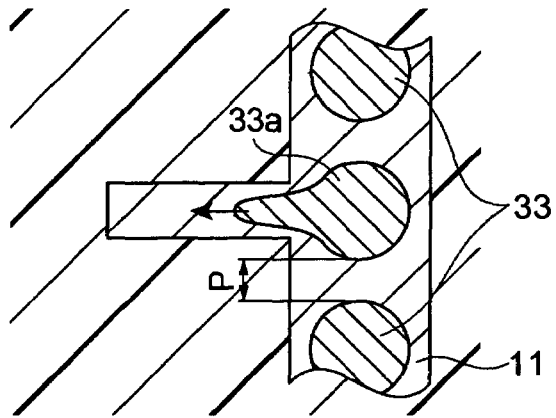
Figure 6A:
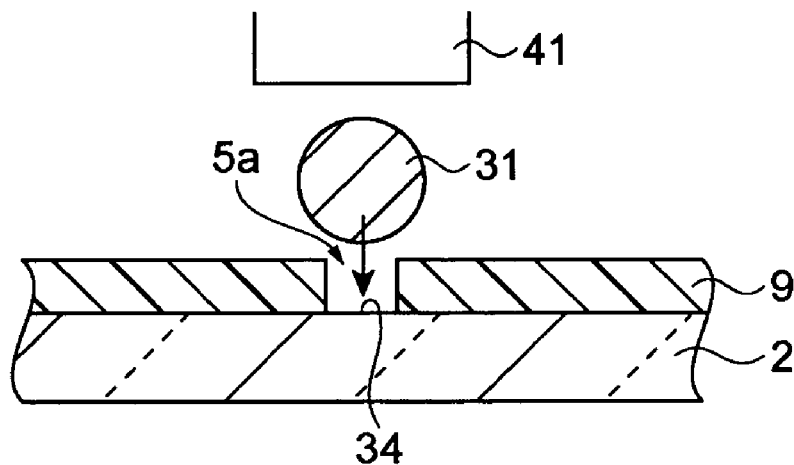
FIGS. 6A through 6C are cross-sectional views showing a method of forming a gate covering layer for the gate electrode.
Figure 6B:
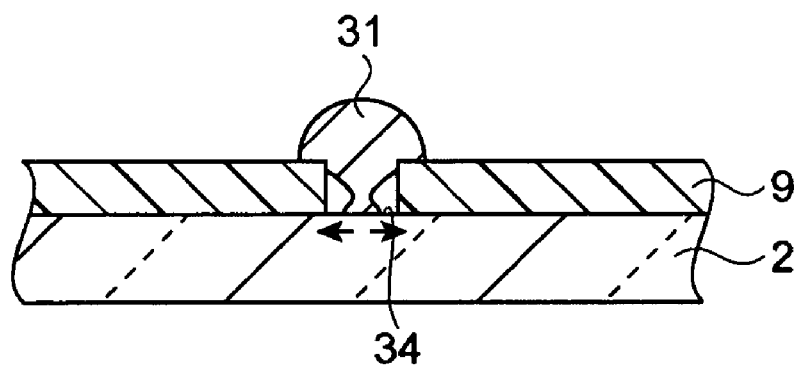
Figure 6C:
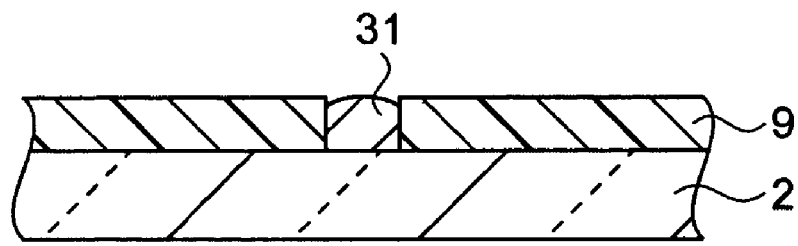

Hereinafter, each of the steps will be explained in detail. FIGS. 4A through 4E are cross-sectional views for sequentially showing the manufacturing steps of the gate wiring and the gate electrode, FIGS. 5A through 5D are plan views for sequentially showing the manufacturing steps of the gate wiring and the gate electrode, and FIGS. 6A through 6C are cross-sectional views showing the forming steps of the gate covering layer of the gate electrode. Each of the cross-sectional views of FIGS. 4A, 4B, 4C, and 4D and the respective one of the plan views of FIGS. 5A, 5B, 5C, and 5D illustrate the same condition as the cross-sectional view and the plan view, respectively. Note that a glass substrate is used as the TFT substrate 2 in the present embodiment. The description of each of the steps is given using formation of the gate intermediate layer 10 as an example.

Bank Forming Step (Step 1)

Firstly, an HMDS treatment is executed on the TFT substrate 2 as a surface reformation treatment. The HMDS treatment is executed by coating vapor form of hexamethyldisilazane $((CH_3)_3SiNHSi(CH_3)_3)$. Thus, the adhesiveness of the first layer bank 9 with the TFT substrate 2 can be improved.

The first layer bank 9 is a member functioning as a separating member, and can be formed using a desired process such as a photolithography process or a printing process. If, for example, a photolithography process is used, an organic photosensitive material is coated on the TFT substrate 2 treated with the HMDS treatment using a predetermined process such as a spin costing process, a spray coating process, roll coating process, a dye coating process, or a dip coating process so that the height thereof matches the height of the first layer bank. 9, and then a resist layer is coated thereon. And, the mask is provided in accordance with the shape of the first layer bank 9, and the resist is then exposed and developed to remain the resist in accordance with the shape of the first layer bank 9. Finally, the organic photosensitive material in other areas than the mask area by etching. Further, the first layer bank 9 can be formed as a multi-layered structure composed of a lower layer made of an inorganic matter and an upper layer made of an organic matter. Thus, as shown in the cross-sectional view of FIG. 4A, the first layer bank 9 is provided in an extended manner so as to surround the peripheries of a gate wiring area 3a and a gate electrode area 5a, which are areas reserved for forming the gate wiring 3 and the gate electrode 5, respectively. FIG. 5A is a plan view of the portion shown in FIG. 4A. The cross-section along the B-B' line is shown in FIG. 4A.

As the organic material for forming the first layer bank 9, a material presenting lyophobicity with each of the droplets can be used, or as described below, an insulating organic material, which can be provided with lyophobicity (can be fluorinated) by a plasma process, has good adhesiveness with the TFT substrate 2, and can be easily patterned by a photolithography process, can also be used. For example, a polymer material such as acrylic resin, polyimide resin, olefin resin, phenol resin, or melamine resin can be used. Alternatively, a material having an inorganic framework (siloxane bond) in the principal chain and an organic group attached thereto can also be used.

After forming the first layer bank 9 on the TFT substrate 2, a hydrofluoric acid treatment is executed. The hydrofluoric acid treatment is a treatment for removing the layer formed by the HMDS treatment by etching with, for example, 2.5% hydrofluoric acid. In the hydrofluoric acid treatment, the first layer bank 9 functions as a mask, and, as shown in FIG. 4A, the HMDS layer, which is an organic matter and is positioned at the bottom 34 of the recess formed in the area surrounded by the first layer bank 9, is removed to expose the TFT substrate.

Lyophilicity Providing Process (Step 2)

Subsequently, the lyophilicity providing process for providing lyophilicity to the bottom 34 (the exposed section of the TFT substrate 2) surrounded by the first layer bank 9 is executed. As the lyophilicity providing process, an ultraviolet (UV) irradiation process for exposing to ultraviolet radiation, an $O_2$ plasma process using oxygen as a process gas in the atmospheric conditions, or the like can selectively be used. In the present embodiment, the $O_2$ plasma process is executed.

In the $O_2$ plasma process, the TFT substrate 2 is irradiated with oxygen in a plasma state discharged from a plasma discharge electrode. In an example of conditions of the $O_2$ plasma process, for example, the plasma power is in a range of 50 through 1000W, the flow rate of the oxygen gas is in a range of 50 through 100 mL/min, the relative moving velocity of the TFT substrate 2 to the plasma discharge electrode is in a range of 0.5 through 10 mm/sec, and the temperature of the substrate is in a range of 70 through 90° C.

And, if the TFT substrate 2 is formed of a glass substrate whose surface is lyophilic to the intermediate layer forming functional fluid for forming the gate intermediate layer 10, the lyophilicity of the surface (the bottom 34) of the TFT substrate 2 exposed in the area surrounded by the first layer bank 9 can further be enhanced by executing the $O_2$ plasma process or the ultraviolet radiation process as in the present embodiment. Here, the $O_2$ plasma process or the ultraviolet radiation process is preferably executed so that the contact angle of the bottom section 34 with reference to the intermediate layer forming functional fluid becomes no greater than 20 degrees.

Note that, although the description reads here that the HMDS layer is removed by executing the hydrofluoric acid treatment, the hydrofluoric acid treatment can be omitted if the HMDS layer at the bottom section 34 is fully removed by the $O_2$ plasma process or the ultraviolet radiation process. Further, although the description reads here that either one of the $O_2$ plasma process and the ultraviolet radiation process is executed as the lyophilicity providing process, both of the O2 plasma process and the ultraviolet process can be executed in combination.

Lyophobicity Providing Process (Step 3)

Subsequently, a lyophobicity providing process is executed on the first layer bank 9 to provide lyophobicity to the surface thereof. As the lyophobicity providing process, a plasma process method ($CF_4$ plasma process method) using tetrafluoromethane as the process gas is adopted. In an example of conditions of the $CF_4$ plasma process, for example, the plasma power is in a range of 50 through 1000W, the flow rate of the tetrafluoromethane gas is in a range of 50 through 100 mL/min, the relative movement speed of the base body to the plasma discharge electrode is in a range of 0.5 through 10 mm/sec, and the temperature of the base body is in a range of 70 through 90° C. Note that the process gas is not limited to tetrafluoromethane, but other fluorocarbon gases or a gas such as $SF_6$, $SF_5$, or $CF_3$ can also be used as the process gas. For the $CF_4$ plasma process, a plasma process device mentioned below can be used.

By executing such a lyophobicity providing process, fluorine groups are introduced in the resin forming the first layer bank 9, thus the first layer bank 9 is provided with strong lyophobicity. Note that, although the $O_2$ plasma process as the lyophilicity providing process described above can be executed prior to formation of the first layer bank 9, the $O_2$ plasma process is preferably executed after the first layer bank 9 has been formed because a polymer material such as acrylic resin or polyimide resin has the nature of being more easily fluorinated (provided with lyophobicity) with a pretreatment with $O_2$ plasma.

Note that, although the exposed section (the bottom section 34) of the TFT substrate 2 surrounded by the first layer bank 9 previously treated with the lyophilicity providing process is slightly affected by the lyophobicity providing process for the first layer bank 9, especially in case the TFT substrate 2 is made of glass or the like, lyophilicity of the TFT substrate 2, namely the wetting property of the bottom section 34 of the TFT substrate 2 is not degraded in nature because no introduction of fluorine groups occurs by the lyophobicity providing process.

Intermediate Layer Material Disposing Step (Step 4)

Subsequently, the intermediate layer 10 is firstly formed out of three layers forming the gate wiring 3 and the gate electrode 5 using the droplet election method by the droplet election device. In forming the gate intermediate layer 10, the droplet 31 of the intermediate layer forming functional fluid is firstly disposed on the area of the TFT substrate 2 surrounded by the first layer bank 9. The intermediate layer forming functional fluid contains tetradecane as a solvent (a dispersion medium). In the material disposing step, as shown in FIGS. 4B and 5B, the intermediate layer forming functional fluid is ejected from a droplet ejection head 41 of the droplet ejection device in forms of droplets. The size of the droplet 31 of the intermediate layer forming functional fluid is smaller than the width W2 of the gate wiring region 3a and larger than the width W1 of the gate electrode region 5a.

Regarding the positions of the droplets 31, the droplets 31 are disposed on the gate wiring region 3a in sequence with a predetermined interval P. In this case, since the gate wiring region 3a is surrounded by the first layer bank 9 and the sizes of the droplets 31 are smaller than the width W2 of the gate wiring region 3a, the droplets can be prevented from spreading beyond the area surrounded by the first layer bank 9.

Meanwhile, the droplets 31 ejected to the gate electrode region 5a are ejected towards the bottom section 34 as shown in FIG. 6A, and are drawn by the bottom section 34 having lyophilicity as shown in FIG. 6B to be spread wetting the bottom section 34. Since the droplets 31 are larger than the width W1 of the gate electrode region 5a, a part of each droplet 31 stays on the upper surface of the first layer bank 9. However, since the first layer bank 9 has lyophobicity, the droplets 31 are strongly pulled into the bottom section 34 having lyophilicity to be accommodated in the recess section defined by the first layer bank 9 as shown in FIG. 6C. Mn, which is not diffused through SiN or the like as described above, does not affect the performance of the TFT 1 if it remains on the first layer bank 9 as residual dross. Further, since Mn also has a function as the so-called cap metal, the gate intermediate layer 10 can be formed without removing the residual dross remaining on the gate electrode 5 or the like when forming the first layer bank 9.

The intermediate layer forming functional fluid, which is a liquid material, is composed of a dispersion liquid containing fine particles of Mn dispersed in a dispersion medium. The content rate of Mn in the dispersion medium is approximately 1% in this case. The particle sizes of the Mn fine particles are preferably no smaller than 1.0 nm and no greater than 1.0 μm. If the particle sizes are greater than 1.0 μm, clogging may occur in the election nozzles of the droplet ejection head 41 described in detail below.

The dispersion medium is not limited providing it can disperse the Mn fine particles described above without causing any agglutination. For example, other than water, alcohol such as methanol, ethanol, propanol, or butanol, carbon hydride compounds such as n-heptane, n-octane, decane, dodecane, tetradecane, toluene, xylene, cymene, durene, indene, dipentene, tetrahydronaphthalene, decahydronaphthalene, or cyclohexylbenzene, etherates such as ethyleneglycoldimethylether, ethyleneglycoldiethylether, ethyleneglycolmethylethylether, diethyleneglycoldimethylether, diethyleneglycoldiethylether, diethyleneglycolmethylethylether, 1,2-dimethoxyethane, bis(2-methoxyethyl)ether, or p-dioxane, and further polar compounds such as propylene carbonate, ã-butyrolactone, N-nethyl-2-pyrrolidone, dimethylformamide, dimethylsulfoxide, or cyclohexanone can be exemplified. In the above compounds, in view of dispersibility of the fine particles and stability of the dispersion liquid, further facility of applying to the droplet ejection method, water, alcohol, carbon hydride compounds, and etherates are preferable, and more preferably, water and carbon hydride compounds can be cited. In the present embodiment, tetradecane, which can be dried fast, is used.

The surface tension of the dispersion liquid is preferably in the range. of no less than 0.02 N/m and no greater than 0.07 N/m. When the intermediate layer forming functional fluid is ejected using the droplet ejection process, the surface tension of less than 0.02 N/m easily causes the curved flight because the wettability of the nozzle surface to the intermediate layer forming functional fluid is increased, on the one hand, and the surface tension of greater than 0.07 N/m makes it difficult to control the ejection amount or the ejection timing because the shapes of the meniscuses in the nozzle tips are not stabilized, on the other hand. In order for adjusting the surface tension, a minute amount of a surface tension adjustment agent such as a fluorinated agent, a silicone agent, or a nonionic agent is preferably added to the dispersion liquid as long as the contact angle with the substrate is not substantially decreased. The nonionic surface tension adjustment agent enhances wettability of the substrate to the intermediate layer forming functional fluid, improves the leveling property of the film, and works for preventing microscopic unevenness of the film. The surface tension. adjustment agent can include an organic compound such as alcohol, ether, ester, and ketone, if necessary.

The viscosity of the dispersion liquid is preferably in a range of no less than 1 mPa·s and no greater than 50 mPa·s. When the intermediate layer forming functional fluid is ejected as the droplets 31 using the droplet ejection process, the viscosity of less than 1 mPa·s easily causes contamination in the periphery of the nozzles with the outflow of the intermediate layer forming functional fluid, and the viscosity of greater than 50 mPa·s increases the frequency of the clogging in the nozzle holes, thus making the smooth ejection of the droplets 31 difficult. Further, the ambient atmosphere for ejecting the droplets is preferably set to have temperature of no higher than 60° C. and moisture of no higher than 80%. Thus, more stable droplet ejection can be executed without any clogging in the ejection nozzles of the droplet ejection head 41.

As the TFT substrate 2, various kinds of materials such as glass, quartz glass, a Si wafer, a plastic film, a metal plate, or ceramics can be used. Further, the surface of each of the substrates formed of the various materials can be provided with a semiconductor film, a metal film, a dielectric film, an organic film, or an insulating film as a foundation layer.

Preliminary Drying Step (Step 5)

After ejecting the droplets 31 to the TFT substrate 2, a drying process is executed for removing the dispersion medium and for keeping the film thickness if necessary. The drying process can be executed by, for example, an ordinary hot plate for heating the TFT substrate 2, a process using an electrical heating furnace, or lamp annealing. A light source for the lamp annealing is not particularly limited, but a infrared lamp, a xenon lamp, a YAG laser, an argon laser, a carbon oxide gas laser, or excimer laser using XeF, XeCl, XeBr, KrF, KrCl, ArF, or ArCl can be used as the light source. The light sources having an output power of no less than 10W and no greater than 5000W can generally be used, but in the present embodiment, those of no less than 100W and no greater than 1000W are sufficient.

Calcining Step (Step 6)

The dried film obtained by ejecting the intermediate layer forming functional fluid to the gate intermediate layer 10 and then drying it is further calcined to obtain the gate intermediate layer 10. Specifically, the dried film of the intermediate layer forming functional fluid is heated to calcine to solidify the Mn fine particles contained in the dried film. This heating process is executed in the atmosphere, and can be executed in an inactive ambient gas such as nitrogen, argon, or helium, or a reducing ambient gas such as hydrogen if necessary. The process temperature of the heating process is appropriately determined taking the boiling point (the vapor pressure), the kinds and the pressure of the ambient gas, the thermal behavior such as the dispersibility or the oxidation property of the Mn fine particles contained in the gate intermediate layer 10, presence or absence or the amount of the coating member covering the Mn fine particles, and the allowable temperature limit of the TFT substrate 2 into consideration.

In the calcining step of the present embodiment, the gate intermediate layer 10 is preferably heated in the atmosphere at an temperature no lower than the room temperature and no higher than 200° C. using a clean oven. Here, the gate intermediate layer 10 is calcined (heated) at 180° C. for 60 minutes. Table 1 shows the diameter of the droplets 32 of the conductive functional fluid containing Ag ejected to the gate intermediate layer 10 in the succeeding step shown in FIG. 4C and landed thereon with respect to the contact angles of droplets 32 to the gate intermediate layer 10, when the gate intermediate layer 10 is calcined at different calcining temperatures. The calcining period is 60 minutes for each. According to Table 1, the contact angle is in a range of 2.2 degree through 5 degree, and Ag sufficiently spreads on to wet the gate intermediate layer 10 filling the gate electrode region 5a having a narrow width. Here, the knowledge that Ag can spread to wet if the contact angle satisfies the condition of no greater than 20 degrees. As a result, the diameter of the droplet when landing becomes the largest at 180° C. and the smallest at the temperature as low as 120° C. At 250° C., a crack is caused in the gate intermediate layer 10. According to the result, it can be said that, as the calcining conditions, the calcining process at a temperature no higher than 200° C. is preferable, and the calcining process at a temperature of 180° C. is the best suitable.

TABLE 1

|  | Calcining Temperature (° C.) | | | |
| --- | --- | --- | --- | --- |
|  | 120 | 180 | 200 | 250 |
| Functional Fluid Droplet Landing Diameter (μm) | 94 | 126 | 122 | (104) |
| Contact Angle (degree) | 5 | 2.2 | 2.4 | (3.7) |

Conductive Layer Material Disposing Step (Step 7)

Subsequently, the gate conductive layer 11 containing Ag is formed on the gate intermediate layer 10. In the process of forming the gate conductive layer 11, as shown in FIGS. 4C and 5C, the droplets 32 of the conductive functional fluid containing Ag are ejected from the droplet ejection head 41 to the gate intermediate layer 10. The droplets 32 are disposed in the area, on which the gate wiring 3 is formed, in sequence with a predetermined interval P. Unlike with the formation of the gate intermediate layer 10, the droplets 32 are not ejected to the gate electrode region 5a. The reason therefor is that Ag is necessary to surely be disposed in the narrow gate electrode region 5a because Ag is diffused through SiN and so on to degrade the function of the TFT 1. If the droplets 32 containing Ag are ejected to the gate electrode region 5a similarly to the droplets 31 of the intermediate layer forming fluid shown in FIGS. 6A through 6C, the residual dross of Ag remains on the first layer bank 9 to diffuse Ag to the gate insulating layer 13 made of SiN.

In order for preventing such diffusion and for making the gate electrode region 5a thinner, the droplet 32 is induced to flow towards the gate electrode region 5a, as shown in FIG. 5C, by utilizing the strong lyophilicity of the droplet 32a ejected to the gate wiring region 3a and positioned nearest to the gate electrode region 5a with the gate intermediate layer 10. Since the gate electrode region 5a is narrow in width, the droplet 32a spreads on to wet the whole of the gate electrode region 5a in the help of the capillary phenomenon. Therefore, it is preferable that the droplet 32a is accurately ejected to the position where the gate electrode region 5a and the gate wiring region 3a are connected to each other, so that the centerline of the width W1 of the gate electrode region 5a conforms with the center of the droplet 32a. As described above, by providing the gate intermediate layer 10 made of Mn and having strong lyophilicity with the droplets 32 containing Ag to the gate electrode region 5a. and the gate wiring region 3a, the gate conductive layer 11 made of Ag can be provided to the gate electrode region 5a without directly ejecting the droplets 32 containing Ag to the gate electrode region 5a. Further, the residual dross of Ag can also be prevented from attaching to the first layer bank 9 in the periphery of the gate electrode region 5a.

Preliminary Drying Step (Step 8) and Calcining Step (Step 9)

The preliminary drying step for the gate conductive layer 11 is the same as that for the gate intermediate layer 10. A supplementary description about the calcining step will simply be presented. The dried film of the droplets 32 of the conductive functional fluid dried after the conductive layer material disposing step needs to be treated with a heating process for acquiring conductivity by removing organic components from the organic silver compound to leave the Ag fine particles. The heating process is usually executed in the atmosphere, and can be executed in an inactive ambient gas such as nitrogen, argon, or helium, or a reducing ambient gas such as hydrogen if necessary. The process temperature of-the heating process is appropriately decided taking the boiling point (the vapor pressure) of the dispersion medium, the nature or pressure of the ambient gas, thermal behavior of the fine particles such as dispersibility or oxidation property, presence or absence or an amount of the coating material, an allowable temperature limit of the base member, and so on into consideration. In the present embodiment, taking the effect to the gate intermediate layer 10 already provided into account, the calcining process is executed at 200° C. for 300 minutes by the clean oven under the atmosphere. According to this process, the dried film is turned out to be the gate conductive layer 11 having conductivity, in which the electrical conductivity among the fine particles is ensured.

As the calcining step, an irradiation process for irradiating the dried film with ultraviolet radiation can be executed instead of the heating process described above. Further, in the calcining step, the heating process described above and the irradiation process for irradiating with the ultraviolet can be executed in combination.

Covering Layer Material Disposing Step (Step 10)

Subsequently, the gate covering layer 12 containing Ni is formed on the gate conductive layer 11. Depending on the shape of the gate covering layer 12, Ag contained in the gate conductive layer 11 can be reinforced and protected, and further can be prevented from diffusing through SiN contained in the gate insulating layer. In the process of forming the gate covering layer 12, as shown in FIGS. 4D and 5D, the droplets 33 of the covering layer forming functional fluid containing Ni are ejected from the droplet ejection head 41 to the gate conductive layer 11. The droplets 33 are disposed on the fate wiring region 3a in sequence with a constant interval P, and similarly to the formation of the gate conductive layer 11, the droplets 33 are not ejected to the gate electrode region 5a.

However, an Ag layer of the gate conductive layer 11 has a contact angle of no greater than 20 degrees with respect to the droplets 33 containing Ni. Therefore, by utilizing the strong lyophilicity of the droplet 33a, ejected to the gate wiring region 3a and positioned nearest to the gate electrode region 5a, with the gate intermediate layer 10, as shown in FIG. 5D, the droplet 33a can be induced to flow in the direction toward the gate electrode region 5a. Since the gate electrode region 5a is narrow in width, the droplet 33a spreads on to wet the whole of the gate electrode region 5a in the help of the capillary phenomenon. As described above, by utilizing the strong lyophilicity of the droplet 33 of Ni with the gate conductive layer 11, the gate covering layer 12 can be provided to the gate electrode region 5a without directly ejecting the droplets 33 of Ni to the gate electrode region 5a.

Preliminary Drying Step (step 11) and Calcining Step (Step 12)

The drying process and the calcining process of the covering layer forming functional fluid for forming the gate covering layer 12 is executed according to the process of the gate conductive layer 11.

Figure 4E:
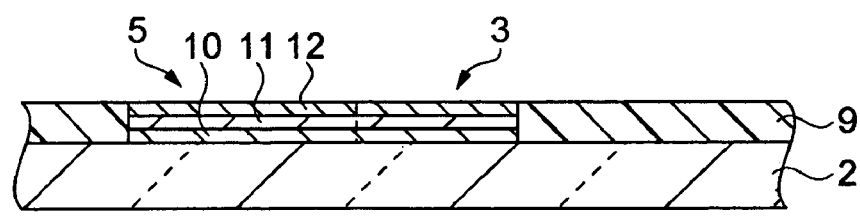

Through the above steps, the gate wiring 3 and the gate electrode 5 shown in FIG. 4E and composed of the gate intermediate layer 10, the gate conductive layer 11, and gate covering layer 12 can be formed. Note that regarding the thickness of each of the layers, the gate conductive layer 11 of Ag is about 0.7 μm, the gate intermediate layer 10 of Mn and the gate covering layer 12 of Ni are 0.2 μm for each.

Device manufacturing equipment used for manufacturing the device according to the embodiment of the invention will hereinafter be explained. As the device manufacturing equipment, a droplet ejection device (an inkjet device) for manufacturing the device by ejecting droplets from the droplet ejection head 41 to the TFT substrate 2 is used.

Figure 7:
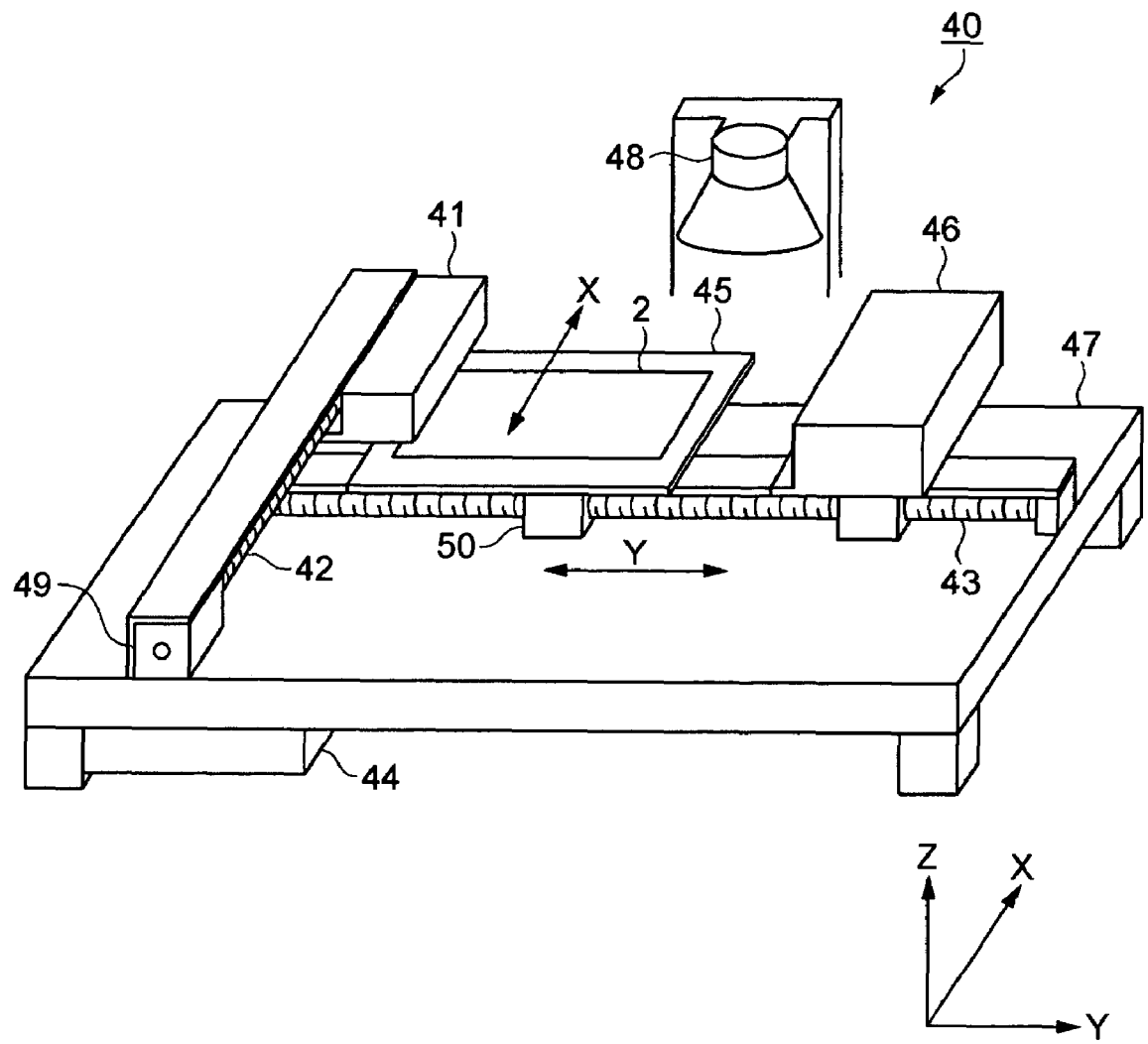
FIG. 7 is a perspective view showing a fluid ejecting device.

FIG. 7 is a perspective view showing the configuration of the droplet ejection device. The droplet ejection device 40 is equipped with the droplet ejection head 41, an X-axis direction drive shaft 42, a Y-axis direction guide shaft 43, a control device 44, a stage 45, a cleaning mechanism 46, a base member 47, and a heater 48.

The stage 45 is for supporting the TFT substrate 2 on which the functional fluid is disposed by the droplet ejection device 40, and is equipped with a fixing mechanism (not shown) for fixing the TFT substrate 2 at the reference position.

The droplet ejection head 41 is a multi-nozzle type droplet ejection head equipped with a number of ejection nozzles, and the longitudinal direction thereof is conformed to the X-axis direction. The number of ejection nozzles are provided to the lower surface of the droplet ejection head 41 so as to be aligned in the X-axis direction with a constant interval. From the ejection nozzles of the droplet ejection head 41, the droplets containing Mn, Ag, or Ni as described above are ejected to the TFT substrate 2.

An X-axis direction drive motor 49 is connected to the X-axis direction drive shaft 42. The X-axis direction drive motor 49 is, for example, a stepping motor, and rotates the X-axis direction drive shaft 42 when a drive signal of the X-axis direction is supplied from the control device 44. In response to the rotation of the X-axis direction drive shaft 42, the droplet ejection head 41 moves in the X-axis direction.

The Y-axis direction guide shaft 43 is fixed to the base member 47 so as not to move therefrom. The stage 45 is equipped with a Y-axis direction drive motor 50. The Y-axis direction drive motor 50 is, for example, a stepping motor, and moves the stage 45 in the Y-axis direction when a drive signal of the Y-axis direction is supplied from the control device 44.

The control device 44 supplies the droplet ejection head 41 with a voltage for controlling the droplet ejection. Further, the control device 44 supplies the X-axis direction drive motor 49 with a drive pulse signal for controlling movement of the droplet ejection head 41 in the X-axis direction, and at the same time, it supplies the Y-axis direction drive motor 50 with a drive pulse signal for controlling the movement of the stage 45 in the Y-axis direction.

The cleaning mechanism 46 is for cleaning the droplet ejection head 41, and is equipped with a Y-axis direction drive motor not shown in the drawings. By driving the Y-axis direction driving motor, the cleaning mechanism 46 moves along the Y-axis direction guide shaft 43. The movement of the cleaning mechanism 46 is also controlled by the control device 44.

A heater 48 here is a means for thermal-treating the TFT substrate 2 by a lamp anneal process, and performs evaporation of the solvent included in the droplets coated on the TFT substrate 2 and dries the substrate. The control device 44 also controls powering on or off of the heater 48.

The droplet ejection device 40 ejects the droplets to the TFT substrate 2 while relatively scanning the droplet ejection head 41 to the stage 45 supporting the TFT substrate 2. Here, in the description below, it is assumed that the Y-axis direction is the scanning direction and the X-axis direction perpendicular to the Y-axis direction is the non-scanning direction. Therefore, the ejection nozzles of the droplet ejection head 41 are provided so as to be aligned in the X-axis direction, the non-scanning direction, with a constant interval. Note that, although the droplet ejection head 41 is aligned perpendicular to the moving direction of the TFT substrate 2 in FIG. 7, the angle of the droplet ejection head 41 can be adjusted so that it traverses the moving direction of the TFT substrate 2. By thus arranged, the nozzle pitch can be adjusted by altering the angle of the droplet ejection head 41. Further, the distance between the TFT substrate 2 and the surface with the nozzles can be arranged to be adjustable according to the desire.

Figure 8:
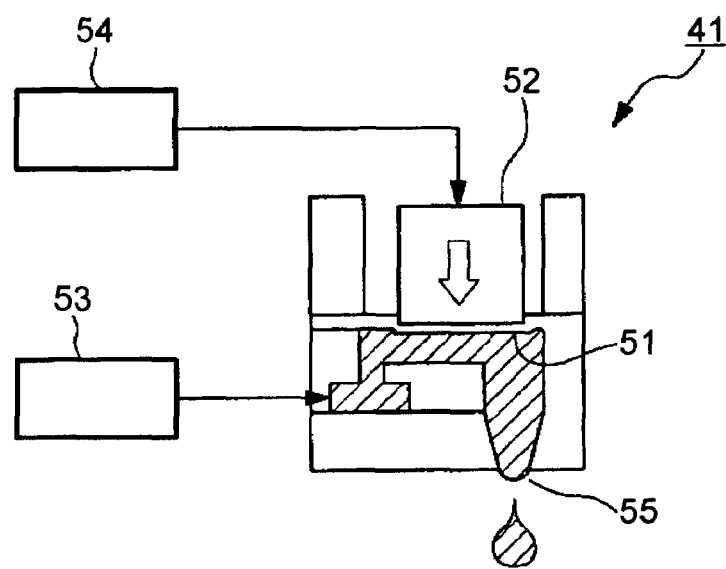
FIG. 8 is a cross-sectional view showing a principle of ejecting the functional fluid using a piezoelectric method.

FIG. 8 is a cross-sectional view showing a principle of ejecting a droplet using a piezoelectric method. In FIG. 8, piezoelectric elements 52 are disposed adjacent to a fluid chamber 51 for containing a liquid material to form the droplets. The liquid material is supplied to the fluid chamber 51 via a liquid material supply system 53 including a material tank for containing the liquid material. The piezoelectric element 52 is connected to a drive circuit 54, and by applying voltage to the piezoelectric element 52 via the drive circuit 54 to distort the piezoelectric element 52, the fluid chamber 51 is also distorted to eject the droplet from the ejection nozzle 55. In this case, an amount of distortion of the piezoelectric element 52 can be controlled by altering the value of the applied voltage. Further, the velocity of distortion of the piezoelectric element 52 can be controlled by altering the frequency of the applied voltage. Since no substantial heat is applied to the material in ejecting droplet using the piezoelectric method, it has an advantage that the composition of the material is hardly affected.

Note that, as other ejection technologies used for the droplet ejection method, the charge control method, the pressure vibration method, the electromechanical conversion method, the electro thermal conversion method, electrostatic absorption method, and so on can be cited. In the charge control method, the liquid material to be ejected is charged by a charge electrode and ejected from an ejection nozzle while controlling its flight orientation by a deflection electrode. Further, in the pressure vibration method, the liquid material is ejected from the tip of the nozzle by applying the material with very high pressure of about 30 kg/cm$^2$, and when no control voltage is applied, the liquid material is forwarded straight to be ejected from the ejection nozzle, and when the control voltage is applied, an electrostatic repelling force is generated in the liquid material to cause the liquid material to fly in various directions and not to be ejected from the ejection nozzle. Further, the electromechanical conversion method corresponds to the piezoelectric method already described above.

Further, in the electro thermal conversion method, the liquid material is rapidly vaporized to generate a bubble by a heater provided in a chamber containing the liquid material, and the liquid material in the chamber is ejected by a pressure caused by the bubble. In the electrostatic absorption method, minute pressure is applied to a chamber containing the liquid material to form a meniscus of the liquid material at the ejection nozzle, and then an electrostatic absorption force is applied in this condition to take the liquid material out of the nozzle. Other than the above methods, a method utilizing viscosity alteration of fluid by electric field or a method for flying the material ,by discharge sparks can also be adopted. The droplet ejection method has advantages that there is little waste in using the liquid material and that a desired amount of liquid material can precisely be disposed on a desired position. Note that the weight of one droplet of the liquid material ejected by the droplet ejection method is, for example, 1 through 300 nanograms.

Figure 9:
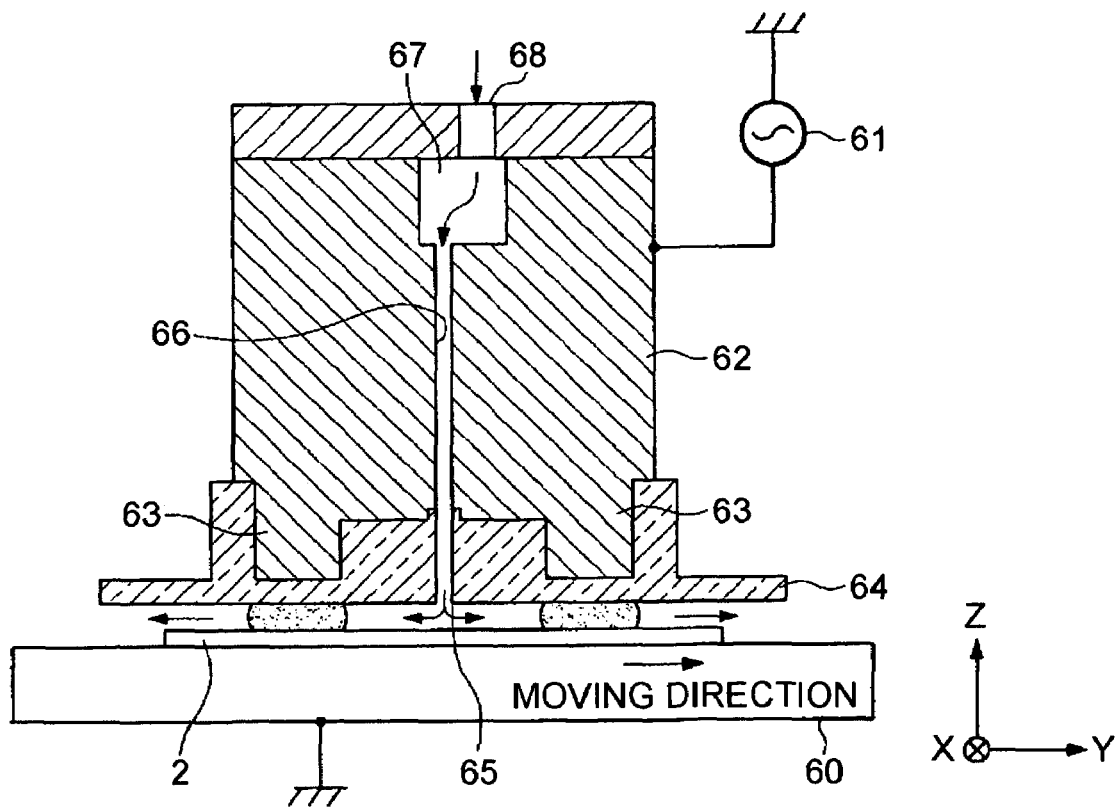
FIG. 9 is a cross-sectional view showing a configuration of a plasma processing device.

FIG. 9 is a cross-sectional view showing a configuration of a plasma process device. The plasma process device shown in FIG. 9 includes an electrode 62 connected to an AC power supply 61 and a sample table 60, which is a grounding electrode. The sample table 60 is arranged to be able to move in the Y-axis direction while supporting the TFT substrate 2. On the lower surface of the electrode 62, there are provided two parallel discharge generating sections 63 extended in the X-axis direction perpendicular to the moving-direction in extended conditions, and a dielectric member 64 so as to surround the discharge generating sections 63. The dielectric member 64 is for preventing abnormal discharge in the discharge generating sections 63. And, the lower surface of the electrode 62 including the dielectric member 64 is substantially flat, and it is arranged that a small amount of gap (the discharge gap) is provided between the discharge generating section 63 including the dielectric member 64 and the TFT substrate 2. Further, at the center of the electrode 62, there is provided a gas ejection port 65, which forms a part of a process gas supplying section formed as a shape elongated in the X-axis direction. The gas ejection port 65 is connected to a gas introduction port 68 via a gas channel 66 and an intermediate chamber 67 inside the electrode.

A predetermined gas including the process gas ejected from the gas ejection port 65 through the gas channel 66 flows in the gap separated into two directions, the forward direction and the backward direction of the moving direction (the Y-axis direction), and is exhausted to the outside from the front end and back end of the dielectric member 64. At the same time, a predetermined voltage is applied to the electrode 62 from the AC power supply 61, and gaseous discharge occurs between the discharge generating section 63 and the sample table 60. And, the plasma generated by the gaseous discharge generates active species of the predetermined gas in the excited state to continuously process the whole surface of the TFT substrate 2 passing through the discharge area.

In the present embodiment, the predetermined gas is a mixture of oxygen ($O_2$) as a process gas, and a noble gas such as helium (He) or argon (Ar), or an inactive gas such as nitrogen ($N_2$) for easily beginning and stably maintaining discharge under pressure nearly equal to the atmospheric pressure. In particular, by using oxygen as the process gas, residual dross of organic matters (the resist or the HMDS) generated in the bottom of the first layer bank 9 when forming the bank can be removed. Namely, in some cases, the HMDS (a kind of organic matters) in the bottom of the first layer bank 9 is not completely removed by the treatment with fluorinated acid executed prior to the lyophilicity providing process of the first layer bank 9. Or, in some cases, the resist (a kind of organic matters) used for forming the bank remains on the bottom of the first layer bank 9. Therefore, by executing the $O_2$ plasma process, the residual dross on the bottom of the first layer bank 9 can be removed.

Figure 10:
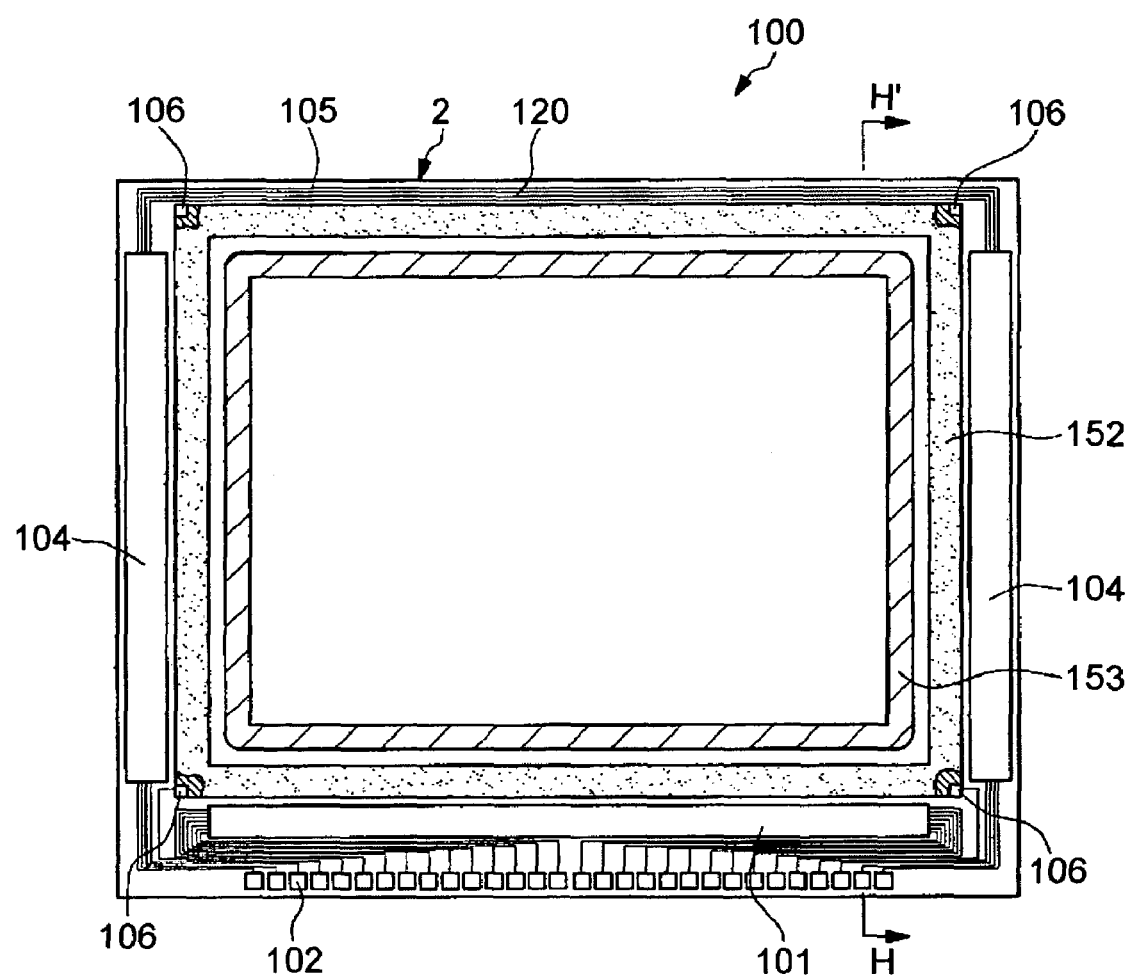
FIG. 10 is a plan view of a liquid crystal display device seen from an opposed substrate.
Figure 11:
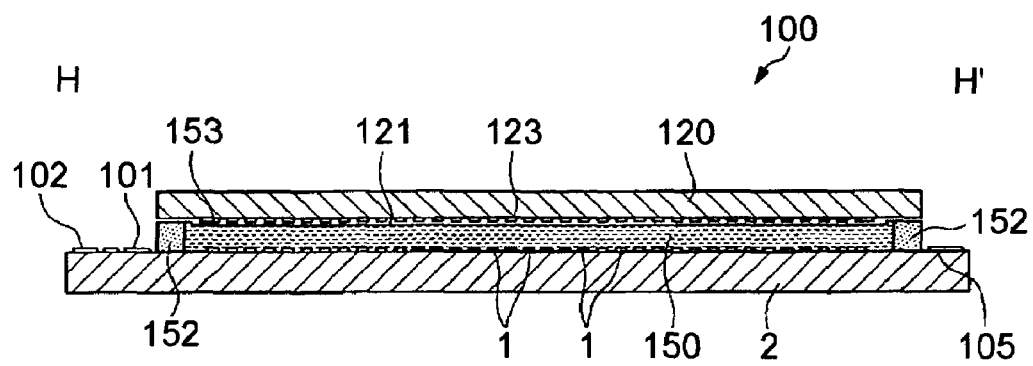
FIG. 11 is a cross-sectional view of the liquid crystal display device along the H-H' line.
Figure 12:
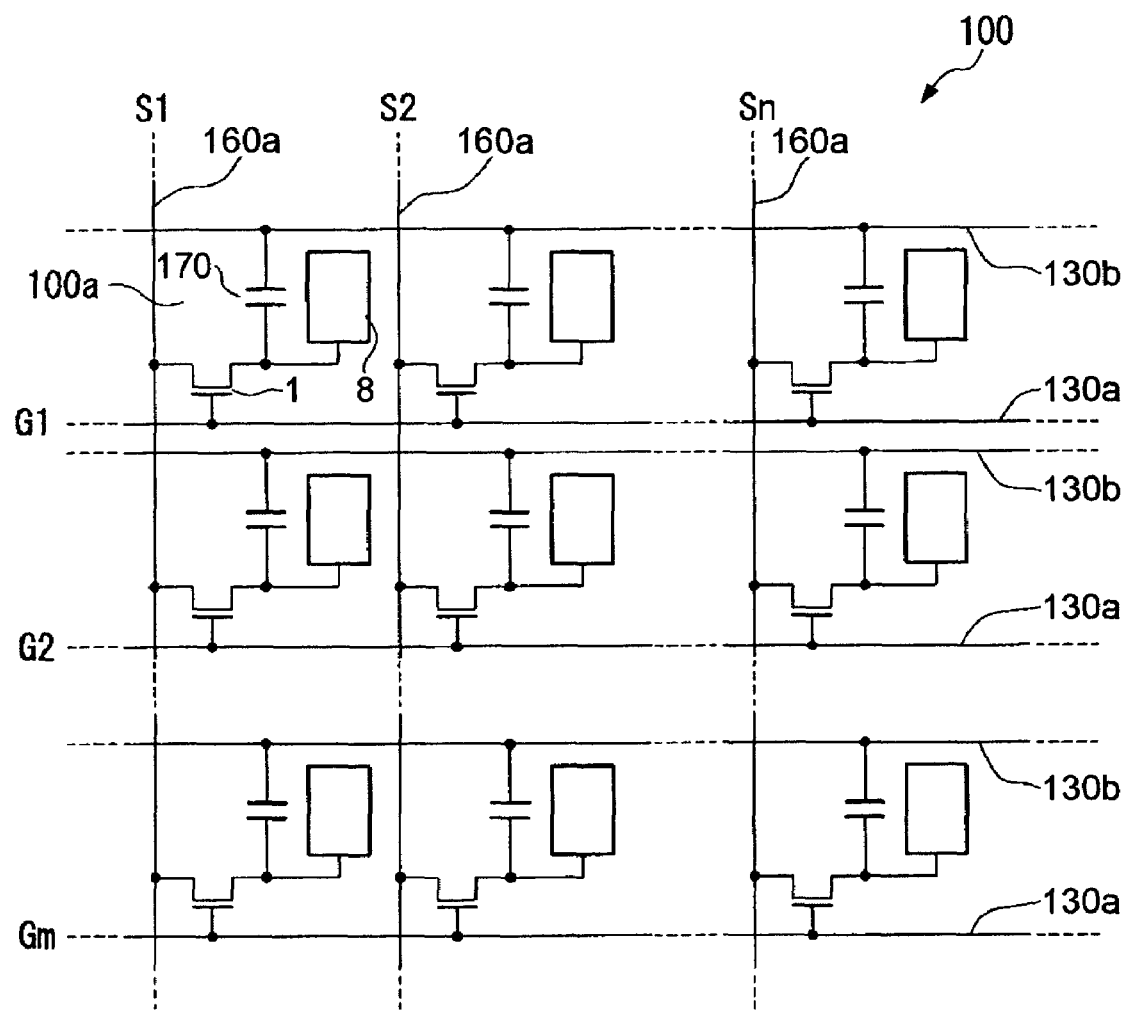
FIG. 12 is an equivalent circuit diagram of components or wiring in a number of pixels of the liquid crystal display device.

A liquid crystal display device, which is an embodiment of an electro-optic device according to the invention, is hereinafter described. FIG. 10 is a plan view showing the liquid crystal display device according the embodiment of the invention viewed from an opposing substrate, and FIG. 11 is a cross-sectional view along the H-H' line in the liquid crystal display device shown in FIG. 10. Further, FIG. 12 is an equivalent circuit diagram of components or wiring in a number of pixels of the liquid crystal display device. Note that the scale ratios of the various layers and the various members may be set differently in the drawings used in the description below in order for illustrating the various layers and the various members in visible sizes on the drawings.

In FIGS. 10 and 11, the liquid crystal display device (electro-optic device) 100 according to the invention has a structure in which the TFT substrate 2 and the opposing substrate 120 making a pair are adhered to each other with a seal member 152, the light curing sealant, and the liquid crystal 150 is encapsulated and held in the region partitioned with the seal member 152. The seal member 152 is formed in the surface of the substrate as a closed frame.

In the inner area of the area in which the sealing member 152 is formed, there is provided a periphery cover 153 made of a light blocking material. In the outer area of the sealing member 152, there are provided a data line drive circuit 101 and mounting terminals 102 along one side of the TFT substrate 2, and scanning line drive circuits 104 are formed along two sides adjacent to the one side. In the remaining side of the TFT substrate 2, there are provided a number of wiring 105 for connecting the scanning line drive circuits provided on the both sides of the image display area. Further, on at least one corner of the opposing substrate 120, there is provided an inter-substrate connecting member 106 for achieving electrical conduction between the TFT substrate 2 and the opposing substrate 120.

Note that, instead of forming the data line drive circuit 101 and the scanning line drive circuits 104 on the TFT substrate 2, for example, a TAB (Tape Automated Bonding) substrate and a group of terminals provided to the periphery of the TFT substrate 2 can electrically and mechanically be connected to each other via an anisotropic conductive film. Note that, although in the liquid crystal display device 100, a wave plate, a deflecting plate, and so on are disposed in appropriate orientations in accordance with a nature of the used liquid crystal, namely, the operational mode such as a TN (Twisted Nematic) mode or a STN (Super Twisted Nematic) mode, or other modes such as normally white mode or normally black mode, the illustration thereof will be omitted here. Further, if the liquid crystal display device 100 is configured to be used as a color display, color filters for red (R), green (G), and blue (B), for example, are formed with their protective films in the area of the opposing substrate 120 facing the respective pixel electrodes 8 of the TFT substrate 2.

In the image display area of the liquid crystal display device 100 having such a structure, as shown in FIG. 12, a number of pixels 100a are configured as a matrix, and each of the pixels 100a is provided with a TFT (a switching device) 1 for pixel-switching, and the data line 160a for supplying a pixel signal S1, S2, ..., or Sn is electrically connected to the source of the TFT 1. The pixel signals S1, S2, ..., and Sn to be provided to the data lines 160a can respectively be supplied to each data line in this order, or can respectively be supplied to each group composed of a number of adjacent data lines 160a. Further, the scanning lines 130a are electrically connected to the gates of the TFTs 1, and it is configured that the scanning signals G1, G2, ..., Gm are respectively supplied to the scanning lines 130a at a predetermined timing in forms of pulses in this order.

The pixel electrodes 8 are electrically connected to the respective drains of the TFTs 1, by turning on the TFTs 1, the switching elements, for a predetermined period of time, the image signals S1, S2, ..., Sn supplied from the data lines 160a are stored in the respective pixels at a predetermined timing. According to this operation, the image signals S1, S2, ..., Sn of predetermined levels stored in the liquid crystal 150 via the pixel electrodes 8 are held between the pixel electrodes and the opposing electrodes 121 of the opposing substrate 120 shown in FIG. 11 for a predetermined period of time. Note that, in order for preventing leakage of the pixel signals S1, S2, ..., Sn held therebetween, storage capacitors 170 are additionally provided in parallel with the liquid crystal capacitors formed between the pixel electrodes 8 and the opposing electrodes 121. For example, the voltages of the pixel electrodes 8 are held by the storage capacitors 170 for longer periods than the periods the source voltages are applied for. Accordingly, the charge holding performance is improved, thus the liquid crystal display device 100 having a high contrast ratio can be realized.

Note that, although the configuration, in which the TFTs 1 are used as the switching elements for driving the liquid crystal display device 100, is described in the above embodiment, it can be applied to, for example, an organic EL (electroluminescence) display device other than the liquid crystal display device. The organic EL display device having a structure, in which a thin film including an inorganic or an organic fluorescent compound is sandwiched by a cathode electrode and an anode electrode, is an element that generates excitons by injecting electrons and holes to the thin film and exciting them to emit light utilizing emission (fluorescence or phosphorescence) of light caused by recombination of the excitons. And, a light-emitting full-color EL device can be manufactured by respectively patterning on the substrate provided with TFTs 1 described above using droplets of the light emitting layer forming materials, namely materials respectively presenting red, green, and blue selected from the fluorescent materials used for organic EL display elements, and droplets of a liquid material for forming a hole injection/electron transport layer. The range of the device (electro-optic device) of the invention also includes such an organic EL device.

Note that, as the device (electro-optic device) according to the invention, in addition to the above devices, a PDP (Plasma Display Panel), and a surface-conduction electron-emitter display (SED or FED (Field Emission Display)), which utilizes a phenomenon of generating electron emission by making current flow in parallel with the surface of a thin film having the small area provided on the substrate, can be adopted.

Figure 13A:
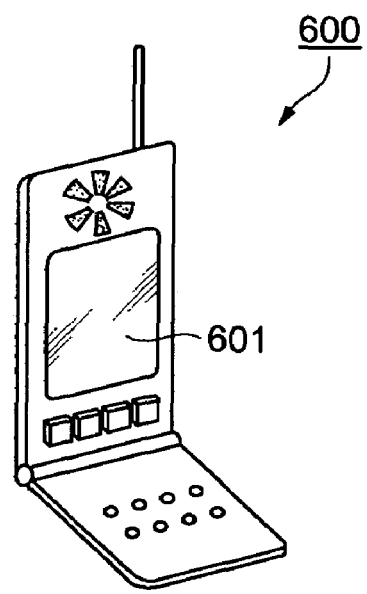
FIGS. 13A through 13C are perspective views respectively showing a mobile phone, a portable information processing device, and a wrist watch each cited as an example of an electronic instrument.
Figure 13B:
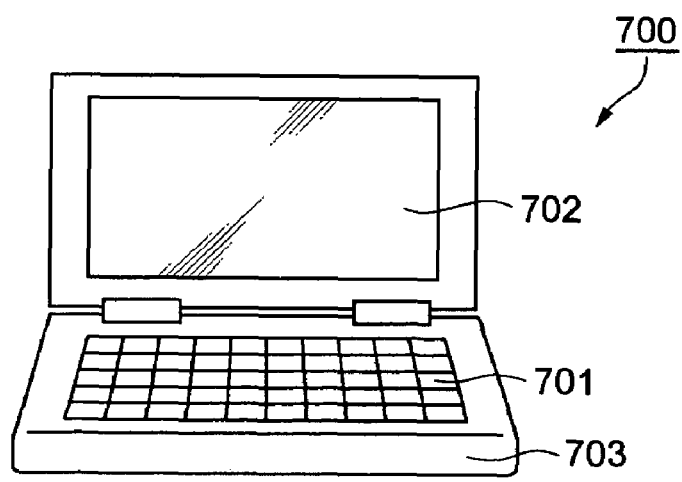
Figure 13C:
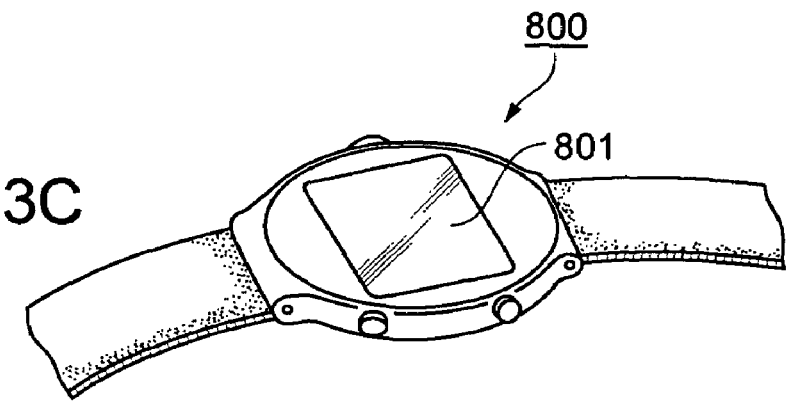

Specific examples of an electronic instrument according to the invention are hereinafter described. FIG. 13A is a perspective view showing an example of a cellular phone. In FIG. 13A, the reference numeral 600 denotes a main body of the cellular phone, and the reference numeral 601 denotes a liquid crystal display section equipped with the liquid crystal display device according to the above embodiment. FIG. 13B is a perspective view showing an example of a portable data processing device such as a word processor or a PC (personal computer). In FIG. 13B, the reference numeral 700 denotes PC, the reference numeral 701 denotes an input section such as a keyboard, the reference numeral 703 denotes an information processing section, and the reference numeral 702 denotes a liquid crystal display section equipped with the liquid crystal display device according to the above embodiment. FIG. 13C is a perspective view showing an example of a wrist watch type of electronic instrument. In FIG. 13C, the reference numeral 800 denotes an electronic watch, and the reference numeral 801 denotes a liquid crystal display section equipped with the liquid crystal display device according to the above embodiment. The electronic instruments shown in FIGS. 13A through 13C are equipped with the liquid crystal display device according to the above embodiment, and have wiring patterns with fine lines in good conditions. Note that, although the electronic instruments according to the present embodiment are described as being equipped with the liquid crystal display device, they can be electronic instruments equipped with another electro-optic device such as an organic electroluminescence display device or a plasma display device. As the electronic instrument, an electronic dictionary, a portable game console, a compact television, a navigation system, and a POS terminal can further be cited.

Hereinafter, the advantages of the embodiments will be summarized.

(1) In order for providing the gate conductive layer 11 made of Ag, which is the main section of the wiring, to the gate electrode region 5a having a microscopic width and communicated with the gate wiring region 3a of the TFT 1, the gate intermediate layer 10 made of Mn and having lyophilicity with the droplet 32 of the conductive functional fluid containing Ag is provided as a base layer. Subsequently, the droplets 32 are ejected to the area of the gate wiring region 3a adjacent to the gate electrode region 5a using the droplet ejection device 40. The droplet 32 automatically flows to the gate electrode region 5a by lyophilicity with the gate intermediate layer 10 to form the gate conductive layer 11. As described above, the gate conductive layer 11 can be formed without ejecting droplet 32 directly to the gate electrode region 5a having a microscopic width to which ejection of a droplet smaller than the width of the gate electrode region 5a is difficult. Therefore, any residual dross of Ag, which is easily diffused through the gate insulating layer 13, is not generated in the periphery of the gate electrode region 5a.

(2) Similarly, according to the formation of the gate conductive layer 11, the droplets 33 of the covering layer forming functional fluid containing Ni are ejected to the gate wiring region 3a lapping over the gate conductive layer 11. By inducing the droplet 33 to automatically flow to the gate electrode region 5a, the gate covering layer 12 is provided to the gate electrode region 5a. The gate covering layer 12 can be formed without ejecting droplet 33 directly to the gate electrode region 5a having a microscopic width to which ejection of a droplet 33 smaller than the width of the gate electrode region 5a is difficult.

(3) Since the bottom 34 of the first layer bank 9, which is the surface of the TFT substrate 2, has lyophilicity and the first layer bank 9 itself has lyophobicity, even the droplet 31, containing Mn and having the diameter larger than the width W1 of the gate electrode region 5a, is strongly pulled in to the bottom 34 to be received by the area surrounded by the first layer bank 9 without staying on the first layer bank 9 forming the gate electrode region 5a. Thus, the gate intermediate layer 10 made of Mn is provided to the gate electrode region 5a. Mn does not cause reactions such as diffusion if it remains on the first layer bank 9, as residual dross, and accordingly, the droplet 31 can be ejected directly to the gate electrode region 5a.

(4) As the conductive functional fluid for forming the gate conductive layer 11, the conductive functional fluid containing silver or a silver alloy is used. Since the conductive functional fluid containing micro particles of Ag or an Ag alloy is easy to be handled, and ejected as droplets, and further can be calcined at a relatively low temperature, it is a desirable material for forming the conductive layer using the droplet ejection process.

(5) Silver or a silver alloy for forming the gate conductive layer 11 is diffused through SiN of the gate insulating layer 13. In order for preventing such diffusion, the gate covering layer 12 made of Ni is formed so as to cover the gate conductive layer 11. Nickel or a nickel alloy has stable characteristics, and accordingly, is preferable for forming the gate covering layer 12.

Further, the invention is not limited to the embodiments described above, but the following modifications can also be adopted.

MODIFIED EXAMPLE 1

In the intermediate layer material disposing step, instead of forming the gate intermediate layer 10 made of Mn on the whole of the gate electrode region 5a and the gate wiring region 3a, the gate intermediate layer 10 can be formed only on the whole of the gate electrode region 5a and a part of the gate wiring region 3a on which the droplet 32a nearest to the gate electrode region 5a is disposed. The time for forming the gate intermediate layer 10 can be reduced.

MODIFIED EXAMPLE 2

The gate conductive layer 11, which is a principal part of the wiring, can be formed using the droplet election device 40 and the other layer, namely the gate intermediate layer 10 and the gate covering layer 12, can be formed using an existing process of CVD. Accordingly, the existing process can be applied in parallel with the present process.

MODIFIED EXAMPLE 3

The disposing intervals P of the droplets 31, 32, and 33 are not limited to constant values, but the droplets can be disposed without any intervals P. The thicknesses of the layers can be adjusted while maintaining the functions of the gate intermediate layer 10, the gate conductive layer 11, and the gate covering layer 12.

What is claimed is:

1. A method of forming a pattern of a functional layer on a surface of a substrate, where a pattern region, to which the pattern is provided, is edged with a boundary layer, and has a first region and a second region communicated with the first region and having a narrower width than the first region, the method comprising:

providing an intermediate layer having adhesiveness with the substrate and lyophilicity with a functional fluid to the first and the second regions;

ejecting a droplet of the functional fluid to the first region; and allowing the droplet of the functional fluid ejected to the first region to flow to the second region due to the lyophilicity of the intermediate layer to the functional fluid, wherein the step of providing the intermediate layer includes ejecting droplets of an intermediate layer forming functional fluid to the first and the second regions, the intermediate layer forming functional fluid having adhesiveness with the substrate and lyophilicity with the functional fluid; and the droplet of the intermediate layer forming functional fluid contains fine particles of one of manganese and a manganese alloy.

2. A method of forming a wiring including a conductive layer formed of a conductive functional fluid on a surface of a substrate where a region, to which the wiring is provided, is edged with a boundary layer, and has a first region and a second region communicated with the first region and having a narrower width than the first region, the method comprising:

providing an intermediate layer having adhesiveness with the substrate and lyophilicity with the conductive functional fluid to the first and the second regions;

ejecting a droplet of the conductive functional fluid to the first region;

allowing the droplet of the functional fluid ejected to the first region to flow to the second region due to the lyophilicity of the intermediate layer to the functional fluid; and forming a covering layer so as to cover the entire surface of the conductive layer, wherein the step of providing the intermediate layer includes ejecting droplets of an intermediate layer forming functional fluid to the first and the second regions, the intermediate layer forming functional fluid having adhesiveness with the substrate and lyophilicity with the conductive functional fluid; and the droplet of the intermediate layer forming functional fluid contains fine particles of one of manganese and a manganese alloy.

3. The method of forming a wiring according to claim 2, wherein the step of forming the covering layer includes:

ejecting a droplet of a covering layer forming functional fluid to the first region; and allowing the droplet of the covering layer forming functional fluid ejected to the first region to automatically flow to the second region with the lyophilicity with the conductive layer.

4. The method of forming a wiring according to claim 3, wherein
the droplet of the covering layer forming functional fluid contains fine particles of one of nickel and a nickel alloy.

5. The method of forming a wiring according to claim 3, wherein
the droplet of the covering layer forming functional fluid is at least one of dried and calcined to form the covering layer after ejected from a droplet ejection device.

6. The method of forming a wiring according to claim 2, wherein
each of a contact angle of the droplet of the conductive functional fluid on the intermediate layer and a contact angle of a droplet of a covering layer forming functional fluid on the conductive layer is no greater than 20 degrees.

7. The method of forming a wiring according to claim 2, wherein
the substrate has lyophilicity with the droplet, and the boundary layer has lyophobicity with the droplet.

8. The method of forming a wiring according to claim 2, wherein
the droplet of the conductive functional fluid contains fine particles of one of silver and a silver alloy.

9. The method of forming a wiring according to claim 2, wherein
the droplet of the conductive functional fluid is at least one of dried and calcined to form the conductive layer after ejected from a droplet ejection device.

10. The method of forming a wiring according to claim 2, wherein
the droplet of the intermediate layer forming functional fluid is at least one of dried and calcined to form the intermediate layer after ejected from a droplet ejection device.

11. A semiconductor device comprising the wiring formed using the method of forming a wiring according to claim 2.

12. A TFT device comprising the wiring formed using the method of forming a wiring according to claim 2, wherein
a gate wiring region of the TFT device is the first region, and
a gate electrode region is the second region.

13. An electronic instrument comprising the TFT device according to claim 12.

14. An electro-optic device comprising the wiring formed using the method of forming a wiring according to claim 2.

15. An electronic instrument comprising the electro-optic device according to claim 14.

* * * * *